United States Patent
Fujito et al.

(10) Patent No.: US 7,190,615 B2
(45) Date of Patent: Mar. 13, 2007

(54) SEMICONDUCTOR DEVICE

(75) Inventors: Masamichi Fujito, Kodaira (JP); Yutaka Shinagawa, Iruma (JP); Kazufumi Suzukawa, Ichikawa (JP); Ayako Kakuda, Akishima (JP); Akira Kato, Tachikawa (JP); Toshihiro Tanaka, Akiruno (JP)

(73) Assignee: Renesas Technology Corp., Tokyo (JP)

( * ) Notice: Subject to any disclaimer, the term of this patent is extended or adjusted under 35 U.S.C. 154(b) by 13 days.

(21) Appl. No.: 10/810,672

(22) Filed: Mar. 29, 2004

(65) Prior Publication Data
US 2004/0202020 A1 Oct. 14, 2004

(30) Foreign Application Priority Data
Apr. 14, 2003 (JP) ............................ 2003-108604

(51) Int. Cl.
*G11C 11/34* (2006.01)
*G11C 5/06* (2006.01)

(52) U.S. Cl. ........................... 365/185.05; 365/185.11; 365/63

(58) Field of Classification Search .................. 365/51, 365/63, 203.03, 230.06, 185.05, 185.11, 185.21, 365/185.29
See application file for complete search history.

(56) References Cited

U.S. PATENT DOCUMENTS

| | | | |
|---|---|---|---|
| 6,452,862 B1* | 9/2002 | Tomotani | 365/230.06 |
| 6,480,418 B2* | 11/2002 | Tanaka et al. | 365/185.11 |
| 6,839,268 B2* | 1/2005 | Osada et al. | 365/230.03 |
| 6,909,644 B2* | 6/2005 | Fujioka et al. | 365/230.06 |
| 6,940,762 B2* | 9/2005 | Umezawa | 365/230.06 |

FOREIGN PATENT DOCUMENTS

JP 2000-339983 12/2000

* cited by examiner

*Primary Examiner*—Trong Phan
(74) *Attorney, Agent, or Firm*—Miles & Stockbridge P.C.

(57) ABSTRACT

The read speed of an on-chip nonvolatile memory enabling electric rewrite is increased. The nonvolatile memory has a hierarchal bit line structure having first bit lines specific to each of a plurality of memory arrays, a second bit line shared between the plurality of memory arrays, a first selector circuit selecting the first bit line for each of the memory arrays to connect the selected first bit line to the second bit line, and a sense amp arranged between the output of the first selector circuit and the second bit line. The hierarchal bit line structure having the divided memory arrays can reduce the input load capacity of the sense amp.

20 Claims, 27 Drawing Sheets

SEMICONDUCTOR DEVICE

CROSS-REFERENCE TO RELATED APPLICATION

The present application claims priority from Japanese patent application JP 2003-108604 filed on Apr. 14, 2003, the content of which is hereby incorporated by reference into this application.

BACKGROUND OF THE INVENTION

The present invention relates to a nonvolatile memory enabling electric erase and write and to a semiconductor integrated circuit such as a data processor called a microcomputer or a microprocessor equipped with the nonvolatile memory together with a central processing unit (also called a CPU), e.g., to a technique effective to be applied to a microcomputer equipped with a flash memory.

In the read operation of a flash memory, 1) a read bit line is precharged, 2) a word line is started up at a selective level such as a high level ("H") to turn on a memory cell transistor, 3) upon flowing of a memory current via the memory cell transistor, the precharged bit line is drawn out to a low level ("L"), and 4) the potential of the bit line drawn out to the low level is sensed by a sense amp.

When a threshold voltage (Vth) of a memory cell transistor is lower than a word line potential (word line selected level), a bit line is discharged to read data "1". When the Vth of the memory is higher than the word line potential, the bit line is not discharged to read data "0". At fast read, the bit line capacity must be smaller to be discharged at high speed. Typically, a bit line hierarchical structure is employed. In the bit line load capacity, the drain capacity of the memory is dominant. In the bit line hierarchical structure, a bit line is divided into some blocks to provide a multiple sub-bit line structure. A memory is connected to the divided sub-bit lines. The sub-bit lines are connected via a hierarchical switch to a main bit line. When the bit line hierarchical structure is employed, the bit line load capacity is the total of a sub-bit line load obtained by summing the wiring capacity of sub-bit lines connected to a limited number of memories and the drain capacity of the memories connected and a main bit line load which is mainly a wiring capacity. This is a load capacity of a fraction of the case that all memories are connected to a main bit line without having a hierarchical structure. A memory current discharges these small loads fast to amplify the lowered bit line potential by a sense amp. When performing write, a hierarchical switch including a write word line is turned on to give a write pulse to a main bit line. As a result, the pulse passes through the hierarchical switch to be given to a sub-bit line. It is not applied to other sub-bit lines. As compared with the case that all memories are connected to a main bit line, time to add drain disturb can be significantly reduced.

As another fast read method, there is a structure having a plurality of divided memory arrays each having a read circuit and a write circuit (see Patent Document 1). For example, each of four divided memory arrays has a row decoder and a sense amp whose outputs are connected to a bus line. When there is an access, the highest order address is decided to operate any one of the arrays. Similarly, at write, the highest order address is decided to transfer write data from the bus line to any one of the write circuits.

[Patent Document 1]

Japanese Unexamined Patent Publication No. 2000-339983

SUMMARY OF THE INVENTION

The above hierarchal bit line structure only with main and sub-bit lines cannot solve signal propagation delay due to the main bit line load capacity and cannot cope with the desire to increase the read speed.

In a plurality of divided arrays represented by Patent Document 1, the bit line is completely disconnected between the arrays. This is preferable for increasing the speed. Each of the arrays must be provided with a read circuit, a write circuit and an interface circuit with the bus line corresponding to the number of the divided arrays, resulting in increased size of the circuit. The same main bit line is used at write and read. When applying a high voltage to the bit line at erase and write, a high voltage read data circuit must be considered.

The sense amp part is arranged at the bit line end of the memory array. The number of sense amps must be above the number of bits read in parallel. These are operated in parallel and have a relatively large electric current consumption. For this reason, power noise easily occurs. The sense amp amplifies a very small voltage. Unnecessary noise occurrence results in malfunction. To lower the power source impedance of a power source supplied to the sense amp, the wire width must be large. However, this increases the chip occupation area.

A flash memory for storing a program incorporated in a microcomputer must be read at the same speed as a CPU. With microfabrication, the operation speed of the CPU is increased. However, the flash memory cannot thin an oxide film of a charge accumulation part with microfabrication. Therefore, it is difficult to increase the memory current. The operation speed of the microcomputer is decided by the access time of the incorporated flash memory. A faster read operation is particularly important in the on-chip flash memory in the microcomputer. Thus, the present inventors have found that the flash memory read circuit method must be further devised.

An object of the present invention is to provide a semiconductor integrated circuit which can increase the read speed of an on-chip nonvolatile memory enabling electric rewrite.

Another object of the present invention is to provide a semiconductor integrated circuit which can increase the read speed of an on-chip nonvolatile memory by minimizing the increased circuit size.

The above and other objects and novel features of the present invention will be apparent from the description of this specification and the accompanying drawings.

The representative inventions disclosed in the present invention will be briefly described as follows.

[1]<Read data circuit hierarchization> A semiconductor integrated circuit according to the present invention has a nonvolatile memory enabling electric erase and write over a semiconductor substrate. The nonvolatile memory has a hierarchal bit line structure having first bit lines (BL) specific to each of a plurality of memory arrays, a second bit line (GBLr) shared between the first bit lines of the plurality of memory arrays, and a sense amp (SA) arranged between the first and second bit lines. More specifically, the nonvolatile memory has a hierarchal bit line structure having first bit lines specific to each of a plurality of memory arrays, a second bit line shared between the plurality of memory arrays, a first selector circuit (22) selecting the first bit line for each of the memory arrays to connect the selected line to the second bit line, and a sense amp arranged between the output of the first selector circuit and the second bit line. The hierarchical bit line structure having divided memory arrays can reduce the input load capacity of the sense amp. The divided memory arrays increase the number of bit line selector circuits and sense amps.

The sense amp is a differential sense amp arranged between a pair of memory arrays adjacent to each other, one of a pair of differential inputs is a read signal from the first bit line selected by one of the memory arrays, and the other input is a reference input. Differential sense contributes to a faster read operation.

The semiconductor integrated circuit may have a main amp (MA) whose input terminal is connected to the second bit line. With this, the read operation can be much faster.

The main amp is a differential amp whose differential inputs are connected to a pair of second bit lines adjacent to each other, one of the pair of differential inputs is a read signal outputted to one of the second bit lines, and the other input is a reference input. The main amp is differentiated, so that the read operation is much faster.

[2]<Write data circuit unification> In the above description, write of storage information is focused on. The semiconductor integrated circuit has a third bit line (GBLw) for write shared between the plurality of memory arrays aside from the second bit line. When employing the divided memory array structure, a write circuit and a write data circuit such as a write data latch need not be arranged for each of the memory arrays. The number of the third bit lines corresponds to the number of parallel write bits to the memory array. Parallel write can be made by a desired number of bits (e.g., 512 bytes) without being limited to the number of read bits (e.g., 32 bits) of storage information from the memory array.

The semiconductor integrated circuit has a disconnect circuit (34, DSW) capable of connecting and disconnecting the corresponding first bit line for each of the memory arrays to/from the third bit line. The disconnect circuit of the memory array to be read in a read operation disconnects the third bit line from the first bit line. An undesired load of the third bit line can be disconnected in the read operation, ensuring fast read. Since the memory array to be read is disconnected from the third bit line, the read operation of the second bit line and the write operation of the third bit line can be performed in parallel.

Verify read is performed using the third bit line. The semiconductor integrated circuit has a second selector circuit (30) selecting the third bit line by the number of external parallel input/output bits of data, and a verify amp (31) sensing verify read data from the third bit line selected by the second selector circuit. The verify amp need not be distributed for each of the memory arrays.

[3]<Sense amp power source> The sense amps are distributed by the memory array hierarchization. First power source wires (61, 62) are provided for every plural parallel sense amps along its parallel direction. Second power source wires (63, 64) wider than the first power source wires are provided in positions spaced from the first power source wires. The respective first and second power source wires are connected in a plurality of positions by third power source wires (65, 66) provided in the first bit line direction.

In the hierarchal sense method of the memory array hierarchization, a plurality of read circuits such as sense amps are arranged in a memory mat. The sense amp is arranged to cross the first bit line. Similarly, the power source line crosses the first bit line. When a plurality of sense amps are operated in parallel, current concentration occurs. For this reason, the power source wiring width must be larger to suppress noise occurrence. When this is performed for each sense amp array, the chip occupation area of the nonvolatile memory is increased. The width of the first power source wires for each sense amp array is not increased, the wide second power source wires are provided in positions spaced therefrom, and the first and second power source wires are connected by a plurality of third power source lines along the extension direction of the first bit lines. Operation power sources are not supplied to the sense amp array from one end side in the array direction. They are supplied thereto in parallel from a large number of third power source wires crossing the array direction. When a large number of sense amps are operated in parallel, potential change due to current concentration is difficult to occur. It is possible to suppress the increased chip occupation area due to the power source wires for sense amp.

As a specific form, one of the third bit lines shared between the plurality of memory arrays is provided for every two first bit lines. When the disconnect circuit can connect or disconnect one third bit line to/from any one of the corresponding two first bit lines in each of the memory arrays, the third power source wire may be arranged every two first bit lines in therebetween. The increased chip occupation area due to the third bit line can be minimized.

[4]<Parallel access> The above semiconductor integrated circuit separately has the second bit line for read and the third bit line for write. The disconnect circuit of the memory array to be read in a read operation disconnects the third bit line from the first bit line. A read operation and erase and write operations can be performed in parallel to different memory arrays. In order to perform the erase and write operations in the same cycle, the semiconductor integrated circuit separately has a first address decoder (70, CDEC) selecting the operation of the word line, the first bit line, the disconnect circuit and the sense amp in a read operation, and a second address decoder (71) selecting the operation of the word line and the disconnect circuit in a write operation.

As described above, a storage area storing a rewrite sequence program of a nonvolatile memory and a storage area freely rewritable by the user can be arranged in the same nonvolatile memory. The hierarchal bit line structure realizing the hierarchal sense method is separated from the write bit line structure to perform write and read in parallel in the same memory cycle. While reading and executing the rewrite sequence program, the memory of the user area can be rewritten. The rewrite sequence program need not be transferred to a RAM. The nonvolatile memory can be mounted over a semiconductor integrated circuit not incorporating such RAM.

[5]<Pipeline access> The first and second address decoders employ address code logic performing address mapping so that the memory arrays sharing the sense amp are different to consecutive addresses. When sequentially accessing the adjacent data in access units, different memory arrays are sequentially selected.

Assuming the address mapping, a first pipeline access form will be described. This is realized in such a manner that in a read operation, the first address decoder responds to the change of an address signal to hold the address decode signal and a select signal of the first bit line for each of the corresponding memory arrays by the number of cycles necessary for the read operation, and responds to the change of the address signal to operate the sense amp with delay. This can perform data read of the sequential addresses while changing the address signal for each cycle.

A second pipeline access form may be employed. In a read operation, the first address decoder selects, in parallel, word lines and first bit lines of an address specified by an address signal and the next address, and sequentially drive controls the driving of the second bit line of the respective sense amps corresponding to the specified address and the next address.

[6]<Data processor> The semiconductor integrated circuit has a central processing unit capable of accessing the nonvolatile memory over the semiconductor substrate. The control of erase and write processing to the nonvolatile memory may be performed by the central processing unit. For example, the memory arrays of part of the plurality of memory arrays are a data area, the remaining memory arrays are a management area, and the management area is a storage area of a rewrite sequence control program for rewriting the data area. The central processing unit reads and executes the rewrite sequence control program from the management area and enables rewrite control of the data area.

[7]<Nonvolatile Memory Device>

A nonvolatile memory device according to the present invention has a controller, and one or more nonvolatile memories. The nonvolatile memory is divided into a plurality of memory arrays and has memory arrays belonging to a first group and memory arrays of a second group having memory arrays corresponding to the respective memory arrays belonging to the first group. The controller can control, in parallel, a first access operation to first memory arrays of a predetermined first group and a second access operation to third memory arrays except for the first memory arrays and second memory arrays of the second group corresponding to the first memory arrays.

A plurality of sense amps (SA) are provided between the memory arrays belonging to the first group and the corresponding memory arrays of the second group. Each of the memory arrays has a plurality of first bit lines (BL) and the first bit lines of the memory arrays of the first group and the first bit lines of the corresponding memory arrays of the second group are connected to the input terminals of the sense amps. The outputs of the sense amps are connected to the second bit lines (GBLr). The first and second bit lines are used for a read operation and the third bit line (GBLw) is used for a write operation.

The nonvolatile memory device according to the present invention can perform, in parallel, read and write operations by memory arrays different from each other to shorten turnaround time seen from the user.

<Verify Read>

A semiconductor integrated circuit according to the present invention in another view has a nonvolatile memory enabling electric erase and write over a semiconductor substrate. The nonvolatile memory has a hierarchal bit line structure having first bit lines (BL) specific to each of a plurality of memory arrays, a second bit line (GBLr) shared between the first bit lines of the plurality of memory arrays, a third bit line (GBLv) shared between the plurality of memory arrays, and a sense amp (SA) selectively amplifying data read from the first bit line to output the amplified data to the second bit line in a first read operation and to output the data to the third bit line in a second read operation.

As a specific form of the present invention, the first read operation is a read operation for outputting read data to the outside of the semiconductor integrated circuit. The second read operation is a verify read operation for deciding, based on the read data in data write into the memory array, whether a write operation or an erase operation of data is continued or not.

When performing the read operation and the verify read operation during the write operation in parallel in different hierarchies, the paths of the read data from both are individualized to solve read data conflict from both. Turnaround time seen from the user can be shortened.

DETAILED DESCRIPTION OF THE PREFERRED EMBODIMENTS

<Microcomputer>

Figure 1:
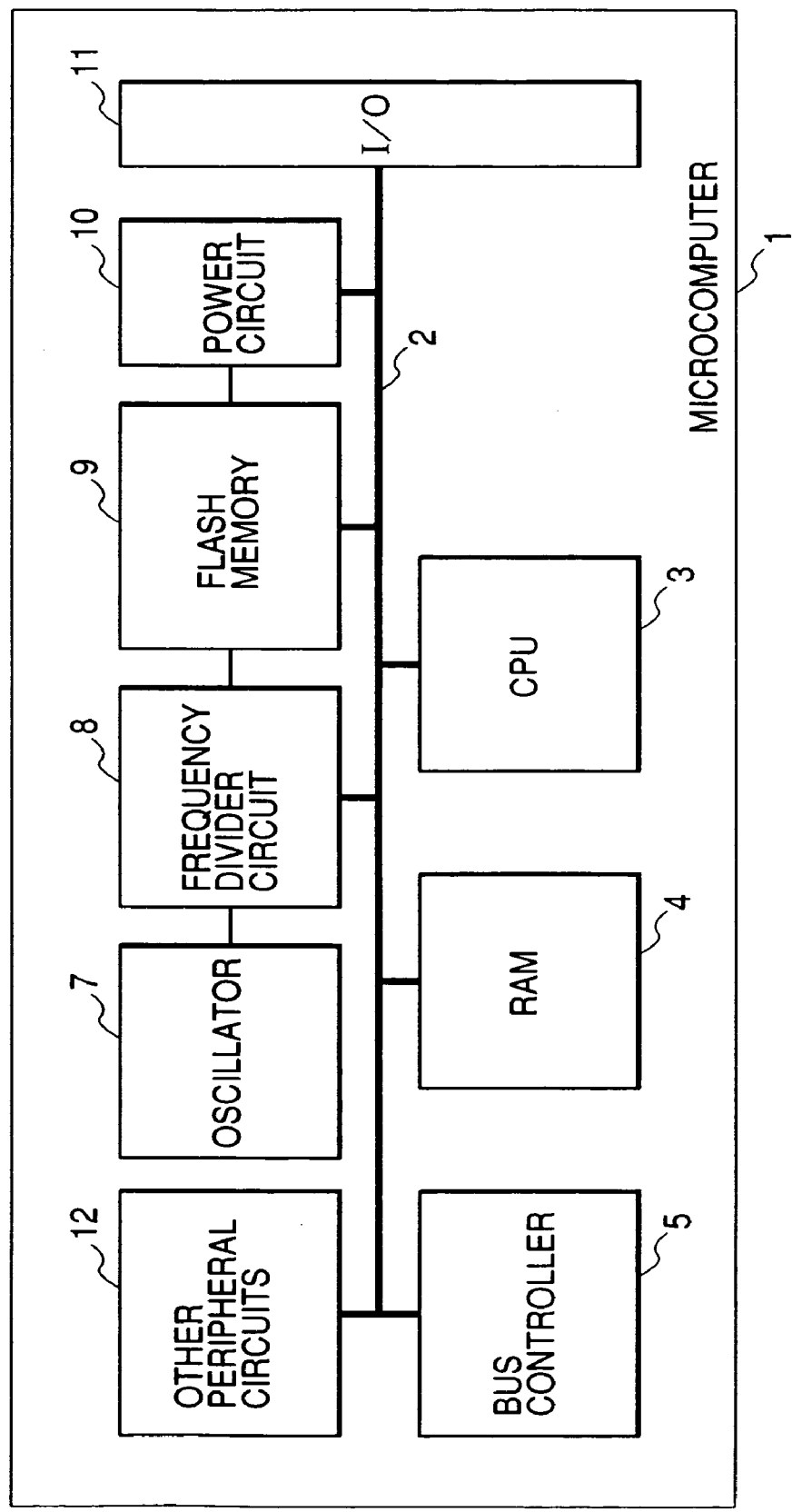
FIG. 1 is a block diagram of a microcomputer as an example of a semiconductor integrated circuit according to the present invention.

FIG. 1 illustrates a single-chip microcomputer called a data processor or a microprocessor as an example of a semiconductor integrated circuit according to the present invention.

The microcomputer shown in the drawing is not particularly limited and is formed over one semiconductor substrate (chip) such as a single crystal silicon by a known semiconductor integrated circuit fabrication technique.

A microcomputer 1 has, as a circuit module connected to an internal bus 2, a central processing unit (also indicated as a CPU) 3, a random access memory (also indicated as a RAM) 4 used for a work area of the CPU 2, a bus controller 5, an oscillator 7, a frequency divider circuit 8, a flash memory 9, a power circuit 10, an input/output port (I/O) 11, and other peripheral circuits 12 such as a timer counter. The CPU 3 has a command control part and an execution part, decodes a fetched command and performs operation processing by the execution part according to the decode result. The flash memory 9 is not particularly limited and stores an operation program or data of the CPU 3. The power circuit 10 generates high voltages for erase and write of the flash memory 9. The frequency divider circuit 8 frequency-divides source oscillation of the oscillator 7 to generate an operation reference clock signal and other internal clock signals. The internal bus 2 includes an address bus, a data bus and a control bus. The bus controller 5 responds to an access request from the CPU 3 to perform bus access control of the number of access cycles, the number of wait states and the bus width according to its accessed address.

In the state that the microcomputer 1 is mounted over the system, the CPU 3 performs erase and write control to the flash memory 9. In the device test or fabrication stage, an external write device, not shown, can directly perform erase and write control to the flash memory 9 via the input/output port 11. After turning on, the inside of the microcomputer 1 is initialized in the low level period of a reset signal. When the high level of the reset signal releases reset, the CPU 2 starts executing the program of the program area specified by the vector of address 0.

<Flash Memory>

Figure 2:
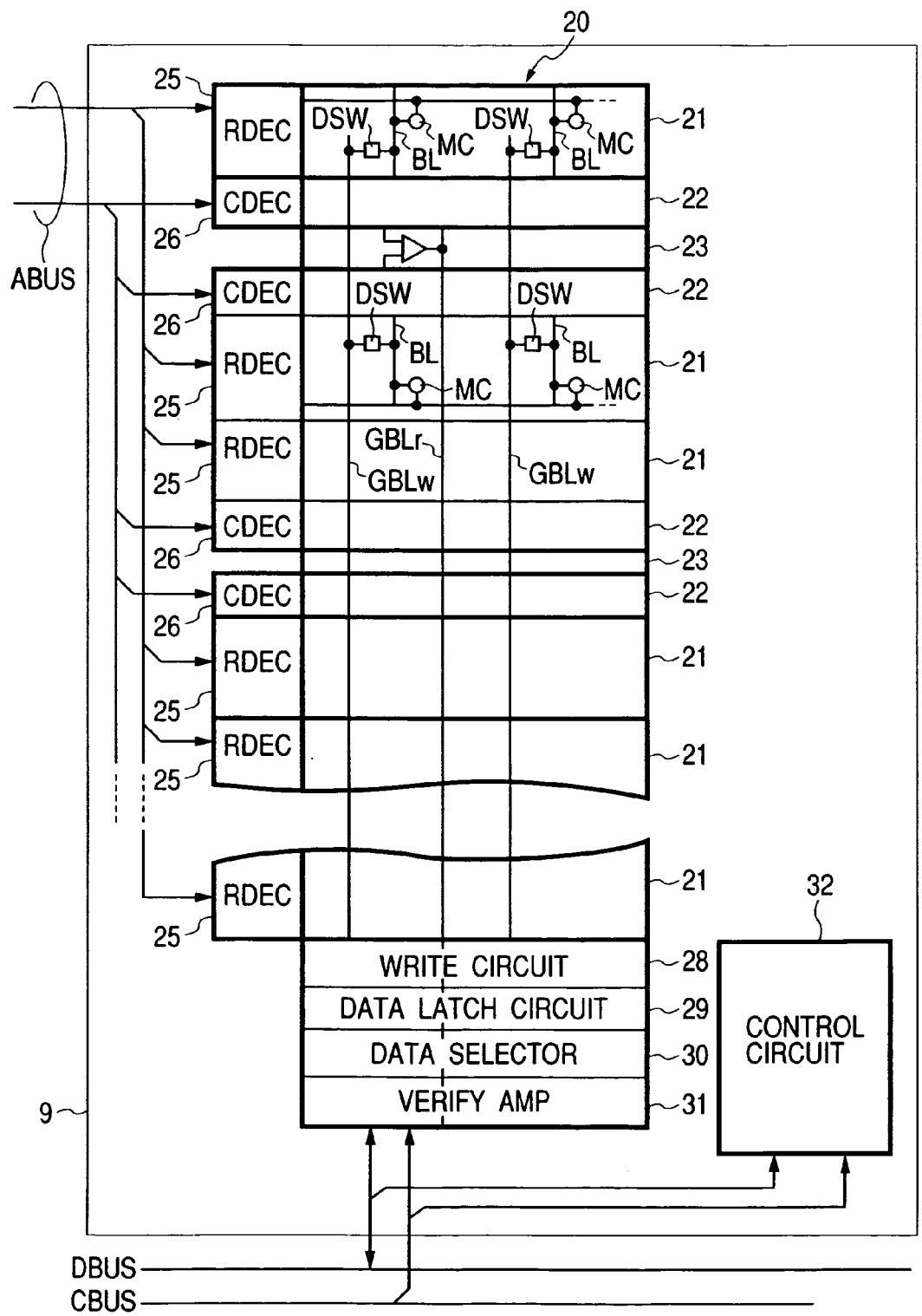
FIG. 2 is a block diagram showing an overall on-chip flash memory.

FIG. 2 is a block diagram showing the overall flash memory 9. The flash memory 9 has a memory mat 20 in which a large number of nonvolatile memory cells MC enabling electric erase and write are arrayed in a matrix. The nonvolatile memory cell MC is not particularly limited and is of a stacked gate structure having a source (source line connection), a drain (bit line connection), a channel, and a floating gate and a control gate (word line connection) stacked over the channel to be insulation-formed mutually. Alternatively, it may be of a split gate structure having a source (source line connection), a drain (bit line connection), a channel, and a selection gate (word line connection) and a memory gate (memory gate control line connection) adjacently insulation-formed mutually over the channel.

The memory mat 20 is divided into a plurality of memory arrays 21. A plurality of sub-bit lines BL are provided for each of the memory arrays 21. The sub-bit line BL is selected by a column selector circuit 22. The output of the column selector circuit 22 is received by a sense amp array 23. One sense amp SA is representatively shown for the sense amp array 23 in the drawing. The output of the sense amp array 23 is connected to read main bit line GBLr shared between the memory arrays. That is, the bit line has a hierarchal bit line structure.

Amplification of the sense amp is performed by a hierarchal sense method. The sense amp array 23 is shared between a pair of memory arrays 21 on the upper and lower sides in the drawing. The write data circuit has write bit line GBLw disconnected from the read data circuit. The write bit line GBLw is not hierarchal to be shared between the memory arrays 21. The sub-bit line BL corresponding to the write bit line GBLw can be selectively connected or disconnected via a disconnect switch DSW. In a read operation, at least, the disconnect switch DSW disconnects the write bit line GBLw from the sub-bit line BL in the memory array to be read. Not being particularly limited, the number of read main bit lines GBLr is 32 and the number of write main bit lines GBLw is 1024.

Word line WL of the nonvolatile memory cell MC is selectively driven according to the decode result of an address signal of a row decoder (RDEC) 25. The driving level is decided depending on erase, write or read processing to the flash memory. The selection of the sub-bit line BL of the column selector circuit 22 is performed according to the decode result of an address signal of a column decoder (CDEC) 26. The disconnect switch DSW and the sense amp SA are controlled by the row decoder 25 by the WRITE HIERARCHY SELECTION LINE and by the SPCs and the SENs according to the read, erase or write operation to the memory array. The address signal is supplied from address bus ABUS. The read main bit line GBLr is connected via bus driver BDRV to data bus DBUS. According to this example, the data bus DBUS has 32 bits. The write bit line is connected to a write circuit 28. The write circuit 28 applies a write voltage to the corresponding write bit line GBLw according to the logic value of each of the bits of write control data of 1024 bits. The write control data is given from a write data latch circuit 29. Write data of 1024 bits given in 32 bits sequentially from the CPU 3 are inputted to the write data latch circuit 29 via a data selector (second selector circuit) 30 to be preset. In verify read, data read out to the write bit line GBLw is selected in 32 bits by the data selector 30. The selected data is amplified by a verify amp 31 to be outputted outside. The data externally read in the verify read is verify-decided by the CPU 3 in bits. The decision result is loaded as new write control data from the CPU 3 via the write selector 30 to the data latch circuit 29. The selection operation of the data selector 30 is not particularly limited and is performed based on the address signal supplied from the address bus ABUS.

A control circuit 32 performs control sequence and operation power source switch control according to read, erase and write operations according to memory control information set from the CPU 3 via control bus CBUS and the data bus DBUS.

<Nonvolatile Memory Cell>

A specific example of the nonvolatile memory cell will be described here.

Figure 3:
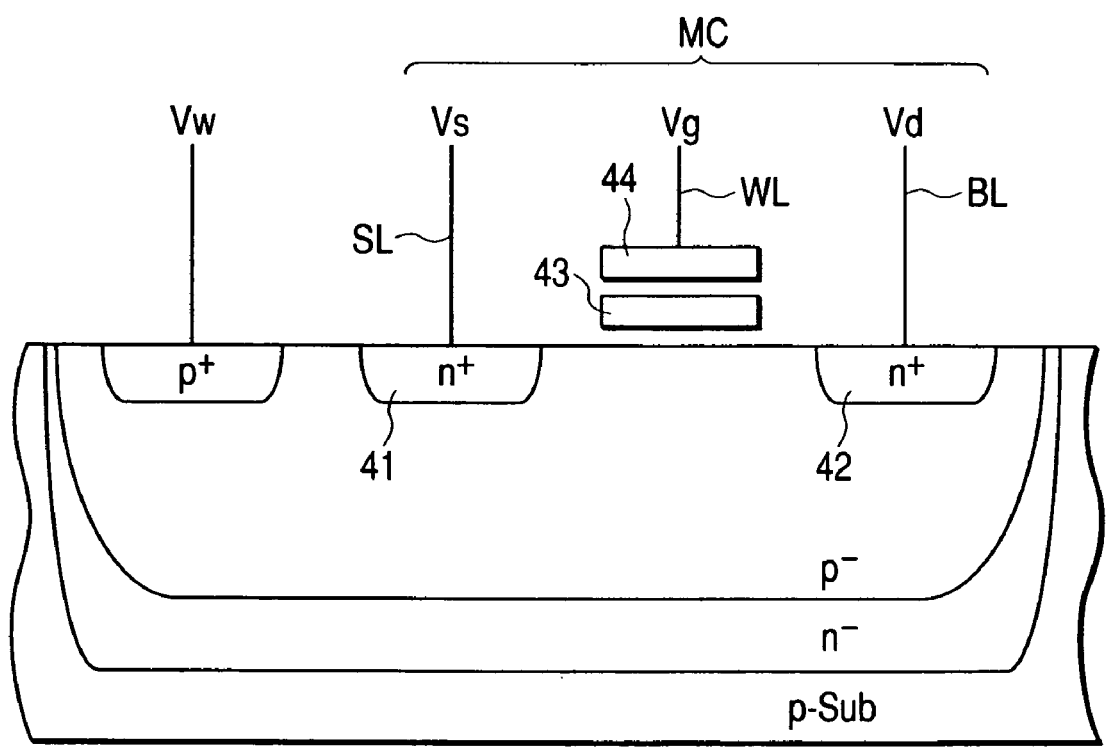
FIG. 3 is a schematic sectional view illustrating a nonvolatile memory cell of a stacked gate structure.

FIG. 3 illustrates a stacked gate structure as an example of the nonvolatile memory cell. The nonvolatile memory cell MC shown in the drawing is formed with a channel area between a source area 40 connected to source line (a second data line) SL, a drain area 41 connected to the source line SL, and a drain area 42 connected to bit line (a first data line) BL. Drain areas 41 and 42 can include an n+ region ("n+"). The stacked gate structure can also include an n− region ("n−"), a p+ region ("p+"), a p− region ("p−"), and a p substrate ("p-Sub"). A floating gate electrode 43 is formed via a gate insulating film over the channel area. A control gate electrode 44 is formed via an oxide film thereover. The floating gate electrode 43 is made by a polysilicon layer. The control gate electrode 44 is made by a polysilicon wire and becomes part of word line WL.

Operation voltages when write is performed by hot carrier injection are as follows. For example, write is performed by hot carrier injection from the drain area 42 to the floating gate 43 when word line voltage Vg is 10V, bit line voltage Vd is 5V, source line voltage Vs is 0V, and well voltage Vw is 0V. Erase is performed by drawing out an electron from the floating gate 43 to the well area when word line voltage Vg is −10V, well voltage Vw is 10V, and the bit line and the source line have high impedance. Read is performed when word line voltage Vg is a source voltage, bit line voltage Vd is a source voltage, source line voltage Vs is 0V, and well voltage Vw is 0V. In erase and write processing, a high voltage must be applied to the word line WL and the well area.

Operation voltages when write is performed by FN tunnel are as follows. For example, write is performed by injecting an electron from the drain through the FN tunnel to the floating gate 43 when word line voltage Vg is −10V, bit line voltage Vd is 10V, source line voltage Vs is 0V, and well voltage Vw is 0V. Erase is performed by drawing out an electron from the floating gate 33 to the well area when word line voltage Vg is 10V, well voltage Vw is −10V, source line voltage Vs is −10V, and the bit line has high impedance. In erase and write processing, a high voltage must be applied to the word line WL, the bit line BL and the well area. Read is the same as above.

<Hierarchal Bit Line Structure>

Figure 4:
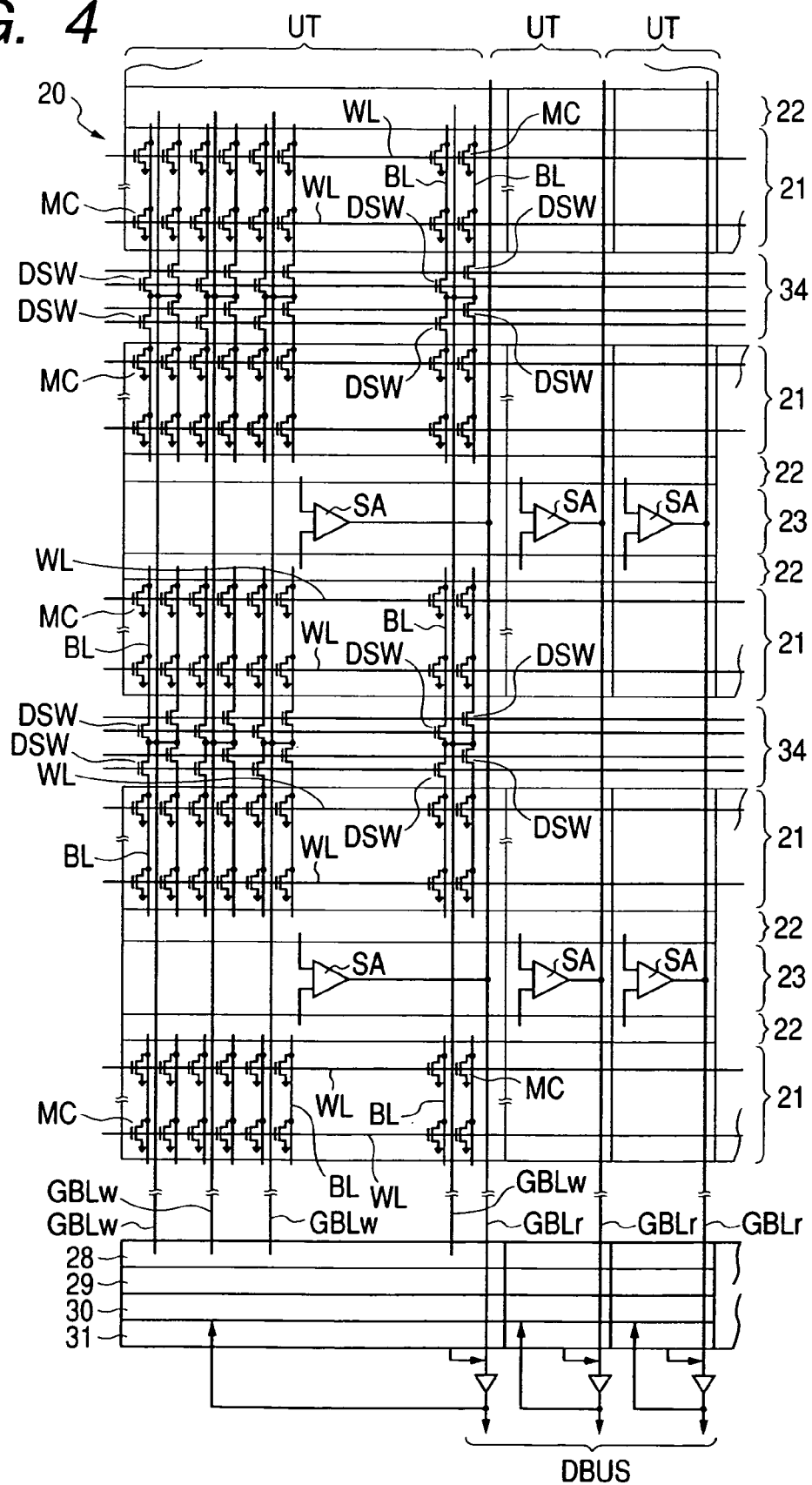
FIG. 4 is a circuit diagram illustrating a detail of a hierarchal bit line structure of a memory mat.

FIG. 4 illustrates a detail of a hierarchal bit line structure of the memory mat. In the example of FIG. 4, one write bit line GBLw can be connected to two bit lines BL via disconnect switch DSW in each of memory arrays. FIG. 4 shows a layout of the disconnect switches DSW as a disconnect switch array 34 between memory arrays 21 adjacent to each other. In the horizontal direction in FIG. 4, 2048 bit lines, 1024 write bit lines GBLw and 32 read main bit lines GBLr are arranged. 32 sense amps SA are arranged in such a manner that one sense amp SA is arranged for 64 bit lines BL. UT means an area in which 64 bit lines are arranged. A column selector circuit 22 selects one in 64 bit lines from 2048 bit lines to connect it to the corresponding sense amp SA. All the disconnect switches DSW are turned off in read and erase operations. In write and verify read operations, 1024 disconnect switches DSW in one row on the side of the memory array to be written are turned on.

For example, in a data read operation, one word line WL is selected and the storage information of the selected memory cell appears on the bit line BL. One of 64 bit lines BL is selected to be transmitted to the input of the corresponding sense amp SA. The sense amp SA drives the corresponding read main bit line GBLr. The hierarchal bit line structure of divided memory arrays can reduce the input load capacity of the sense amp SA. Since 1024 write bit lines GBLw corresponding to the number of parallel write bits to the memory arrays are provided, parallel write can be made by a predetermined number of bits without being limited to the number of read bits (e.g., 32 bits) of the storage information from the memory array.

The bit line BL can be connected and disconnected to/from the write bit line GBLw via the disconnect switch DSW. The disconnect switch DSW of the memory array to be read in a read operation is disconnected from the write bit line. Accordingly, an undesired load of the write bit line GBLw can be disconnected in the read operation, ensuring fast read. In addition, the memory array to be read is disconnected from the write bit line GBLw. The read operation of the read main bit line and the write operation of the write bit line GBLw can be performed in parallel in memory arrays different from each other.

The verify read performs transmission to the verify amp 31 using the write bit line GBLw. The verify amp need not be distributed for each of the memory arrays.

<Differential Sense>

Figure 5:
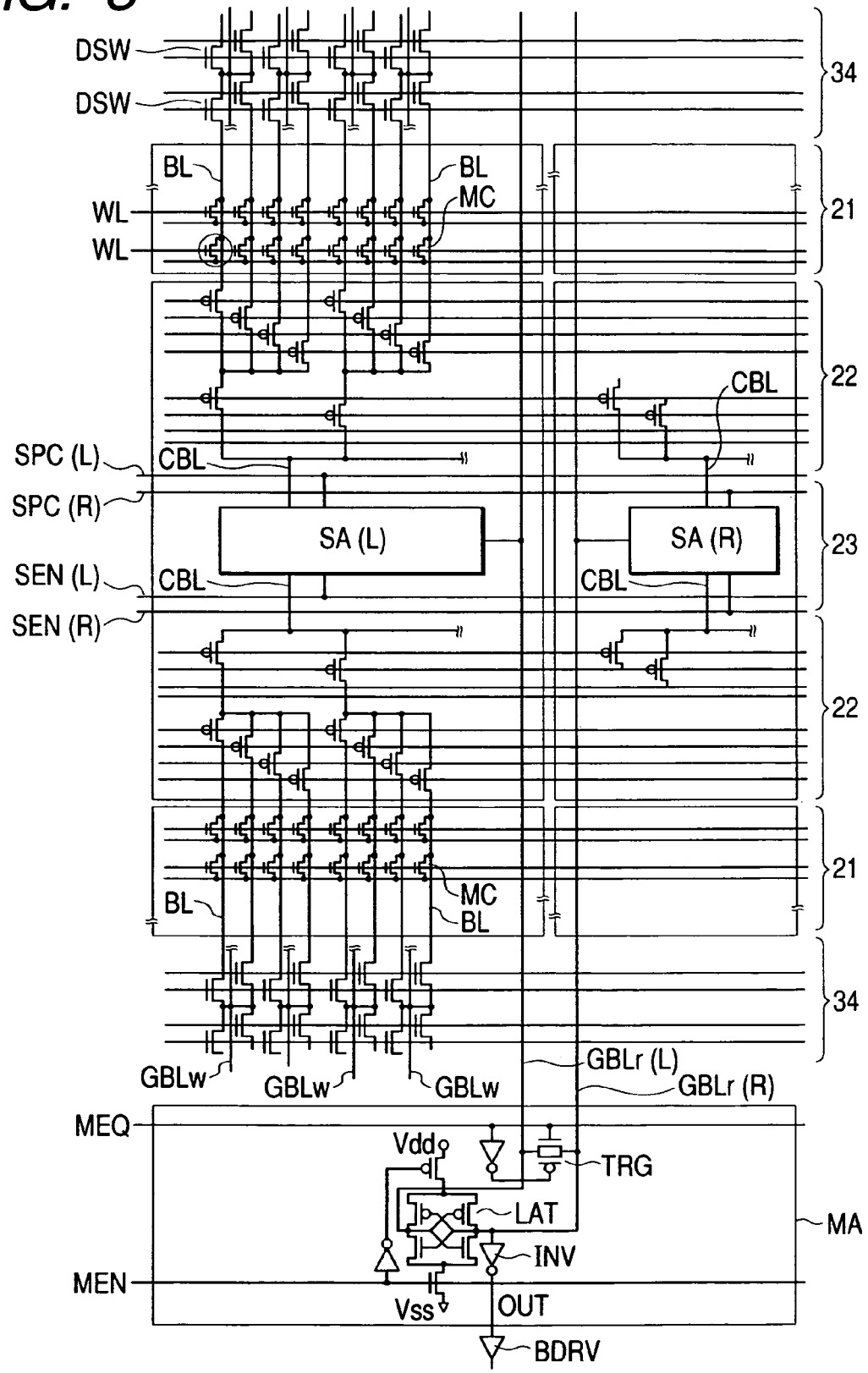
FIG. 5 is a circuit diagram illustrating a detail of a hierarchal bit line structure of the memory mat performing differential sense.

FIG. 5 illustrates a detail of a hierarchal bit line structure of the memory mat performing differential sense. In the example of FIG. 5, the sense amplifiers ("sense amps") SA(L) and SA(R) have a differential amplification form performing differential input to a pair of memory arrays adjacent to each other on the upper and lower sides of the drawing. Sense amplifiers SA(L) and SA(R) also receive an input signal CBL and operate in accordance with control signals SPC(L), SPC(R), SEN(L) and SEN(R). One of a pair of differential inputs is a read signal from the bit line BL selected by one of the memory arrays and the other input is a reference input. The differential sense contributes to a faster read operation. The read main bit line GBLr is provided with a main amp MA so that the read operation is much faster. A differential amp is used as the main amp MA. One of a pair of main bit lines GBLr (L), GBLr (R) is a read signal input and the other is a reference input. The main amp MA is differentiated so that the read operation is much faster. The differential main amp MA is employed so that FIG. 5 is different from FIG. 4 in that the sense amp SA is provided for 32 bit lines BL as a unit and 64 sense amps are totally provided. Both are similar in that the write processing unit to the nonvolatile memory is 1024 bits and the external input and output unit is 32 bits.

The main amp MA has transfer gate TRG switch-controlled by equalize signal MEQ and making the corresponding pair of read main bit lines GBLr (L), GBLr (R) conductive, static latch LAT connected to the corresponding pair of read main bit lines GBLr (L), GBLr (R) and actively and inactively controlled by amp enable signal MEN, and output inverter INV whose input terminal is connected to the input/output node on one side of the static latch LAT and whose output terminal is connected to the bus driver BDRV.

Figure 6:
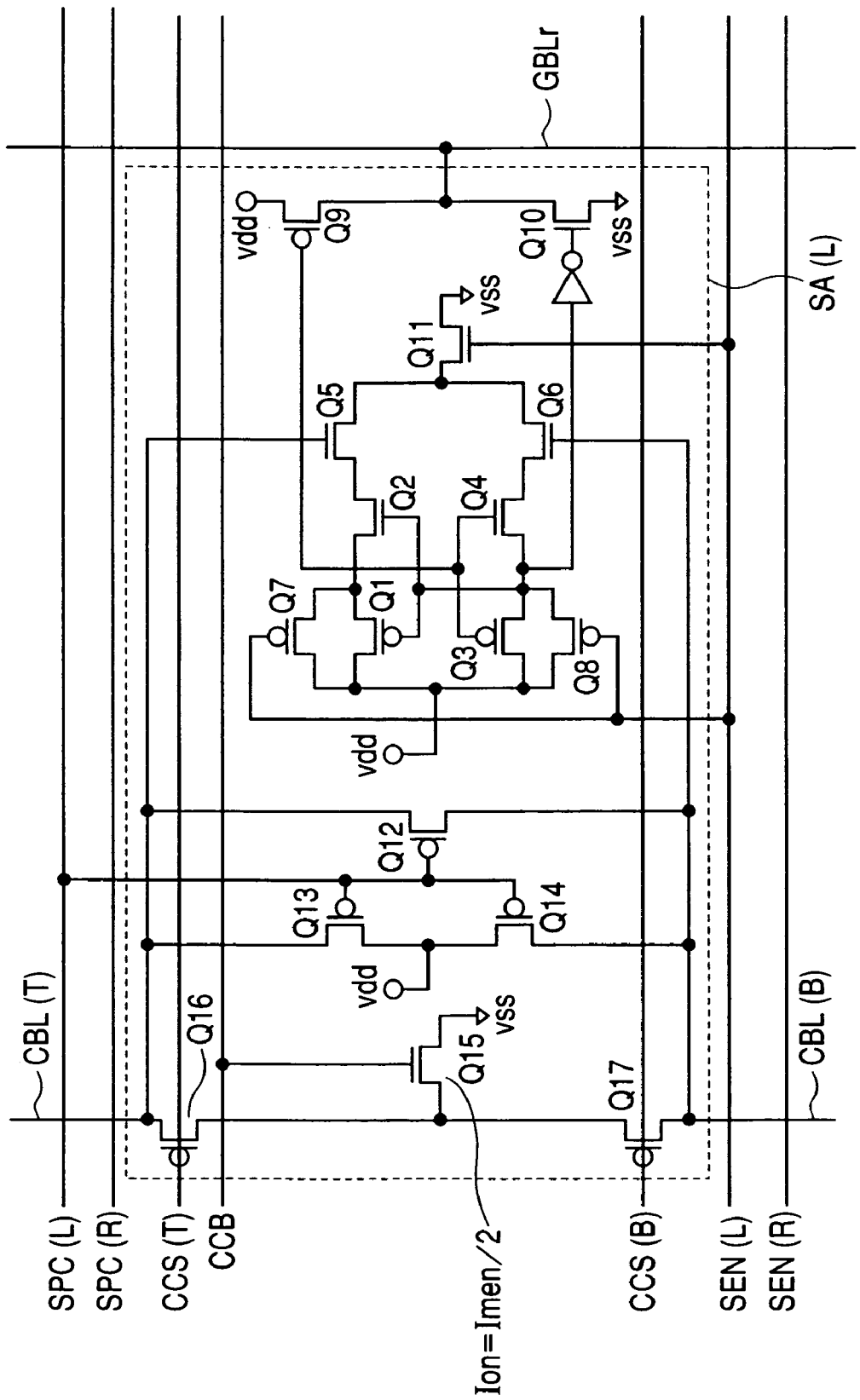
FIG. 6 is a circuit diagram showing an example of a sense amp for differential sense.

FIG. 6 shows an example of the sense amp SA (L) for differential sense. In the drawing, p channel type MOS transistors whose gate electrodes are indicated by small circles are discriminated from n channel type MOS transistors. It has differential input MOS transistors Q5, Q6 connected respectively to output signal line CBL (T) of one of memory arrays and to output signal line CBL (B) of the other memory array. These are connected to a latch circuit in a static latch form by MOS transistors Q1 to Q4. The MOS transistors Q1, Q4 are provided respectively with initializing MOS transistors Q7, Q8 in parallel to be connected to the source voltage. The common source of the MOS transistors Q5, Q6 is connected via a power switch MOS transistor Q11 to the ground voltage Vss of the circuit. The gates of transistors Q7 and Q11 are connected to sense amplifier control signal SEN(L). Sense amplifier control signal SEN (R) is connected to corresponding transistor gates in sense amplifier SA(R) (not shown in FIG. 6). One of a pair of storage nodes of the latch circuit of the MOS transistors Q1 to Q4 is connected to the gate of a MOS transistor Q9 of the output inverter. The other is inverted and connected to the gate of a MOS transistor Q10 of the output inverter. The common drain of the MOS transistors Q9, Q10 constructing the output inverter is connected to the corresponding read main bit line GBLr. The numeral Q12 denotes an equalize MOS transistor of the CBL (T) and CBL (B). The numerals Q13, Q14 denote precharge MOS transistors. The gates of transistors Q12, Q13 and Q14 are connected to sense amplifier control signal SPC(L). Sense amplifier control signal SPC(R) is connected to corresponding transistor gates in sense amplifier SA(R) (not shown in FIG. 6). The numeral Q15 denotes a comparison current MOS transistor. The numerals Q16, Q17 denote transfer MOS transistors controlled by signals CCS(T) and CCS(B) selectively making the comparison current MOS transistor Q15 conductive to the signal lines CBL (T) and CBL (B). The comparison current MOS transistor Q15 flows an electric current of half of an electric current flowing to the memory cell MC in the on state by a gate bias voltage CCB (Ion=Imen/2).

In the inactivating period in the sense amp SA (L), the transistors Q7, Q8 are turned on, the transistor Q11 is turned off, and the output inverter having the transistors Q9, Q10 are brought into a high impedance state. In this state, the transistors Q12, Q13 and Q14 are turned on to precharge both the signal lines CBL (T) and CBL (B) to a high level. When the sense amp SA (L) senses a read signal from the signal line CBL (T) side, the transistors Q7, Q8 are turned off, the transistor Q11 is turned on, the transistor Q17 is turned on, and the transistor Q16 is turned off. A read signal voltage is applied to the transistor Q5. A reference voltage is applied to the transistor Q6. According to both inputs, the output inverter having the transistors Q9, Q10 drives the read main bit line GBLr. In the read operation, the sense amp SA (R) on the opposite side is a reference side and is maintained in the inactive state. At this time, since both the read main bit lines GBLr (L) and GBLr (R) have been equalized, the main amp MA defines the state of the latch circuit LAT according to the high level driving or the low level driving to the read main bit line GBLr (L) of the sense amp SA (L) to drive the bus driver BDRV.

Figure 7:
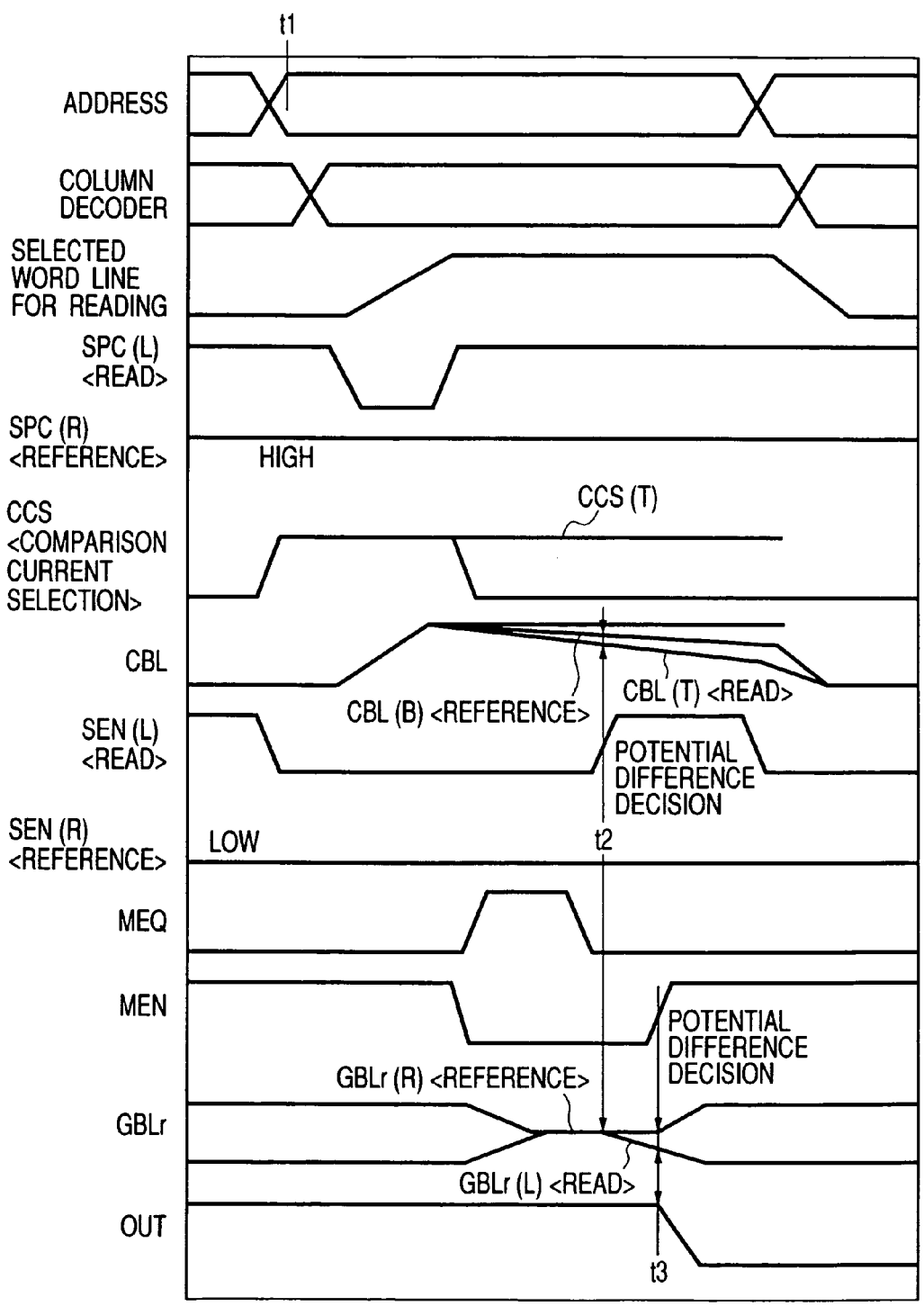
FIG. 7 is a timing chart of data read operations of a differential sense amp and a differential main amp.

FIG. 7 shows a timing chart of data read operations of the differential sense amp and the differential main amp. In the upper memory array 21 in FIG. 5, the storage information of the memory cell in the position represented by a circle is read on the SA (L) and the SA (R) is a reference side.

When an address signal is changed at time t0, the selection state of the column decoder is changed in synchronization with it to start selection of the word line. During this, SPC (L) is brought to the low level to perform the precharge and equalize operations of the sense amp SA (L). The precharge and equalize operations of the sense amp SA (R) on the reference side remain disabled. The comparison current selection switches Q16, Q17 are brought into the off state at the precharge and equalize operations of the sense amp SA (L). The signal lines CBL (B) and CBL (T) are charged from the low level to the high level. When the precharge and equalize operations of the sense amp SA (L) are terminated, the comparison current selection switch Q17 on the non-sense side is turned on. On the signal line CBL (T) side, the level is changed according to the threshold voltage of the memory cell. On the signal line CBL (B) side, the level is changed according to the reference current flowed to the Q15. Until the level change is increased to some degree, the sense amp SA (L) is inactive. During this, the main amp MA is equalized and the read main bit lines GBLr (R), GBLr (L) are brought to the intermediate level. When the sense amp SA (L) is activated at time t2, a difference voltage of the signal lines CBL (T) and CBL(B) is differentiated and amplified to amplify the read main bit lines GBLr (R), GBLr (L). The main amp MA is started up at time t3 to further amplify the read main bit lines GBLr (R), GBLr (L), thereby deciding the output OUT. In FIG. 7, signals SPC(L) <READ>, SPC(R) <REFERENCE>, SEN (L) <READ>, and SEN(R) <REFERENCE>are control signals to a sense amp, signals CCS <COMPARISON CURRENT SELECTION>, CCS(T), CBL(B) <PREFERENCE>, and CBL(T) <READ> are input signals to a sense amp, and signals GBLr(R) <REFERENCE> and GBLr(L) <READ> are output signals of a sense amp.

Figure 8:
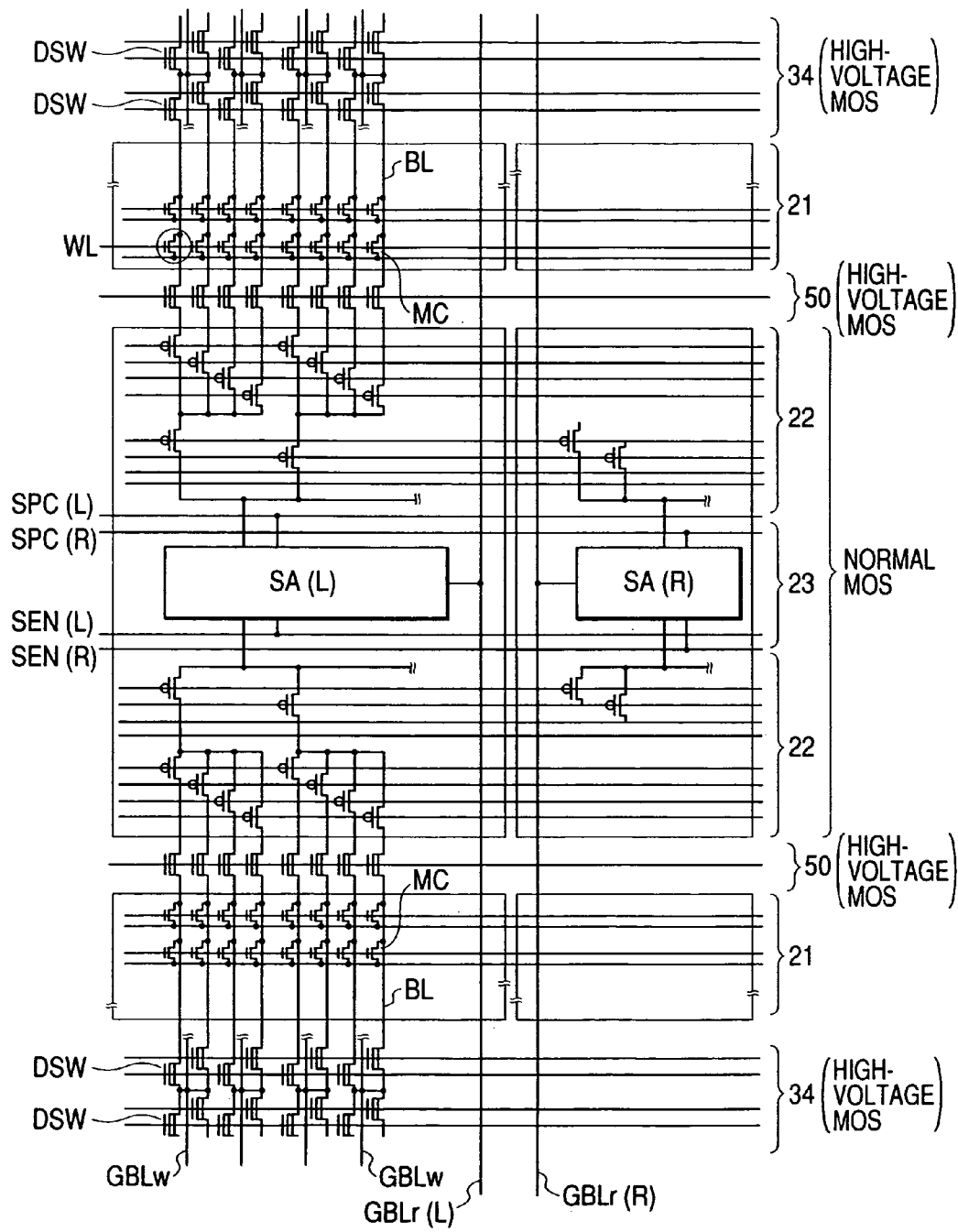
FIG. 8 is a circuit diagram illustrating another detail of the hierarchal bit line structure of the memory mat performing differential sense.

FIG. 8 shows another detail of the hierarchal bit line structure of the memory mat performing differential sense and having the differential amps SA(L) and SA(R). In a structure in which the sense amp and column selector circuit are connected between the memory arrays, it is assumed that a high voltage is applied to the bit line BL at write or erase. In the operation speed of the sense amp and the column selector circuit, it is desirable that the transistor constructing the circuits is not a high-voltage MOS transistor. In this case, as shown in FIG. 8, a disconnect circuit 50 connected and disconnected by the high-voltage MOS transistor may be provided between the memory array and the column selector circuit. Not only in the case of constructing the sense amp and the column selector circuit by the high-voltage MOS transistor, but also in a circuit structure in which a high voltage of write and erase is not applied to the bit line as in the split gate structure, the disconnect circuit 50 is unnecessary. Sense amplifiers SA(L) and SA(R) operate in accordance with control signals SPC(L), SPC(R), SEN(L) and SEN(R).

<Sense Amp Power Source Wiring Layout>

Figure 9:
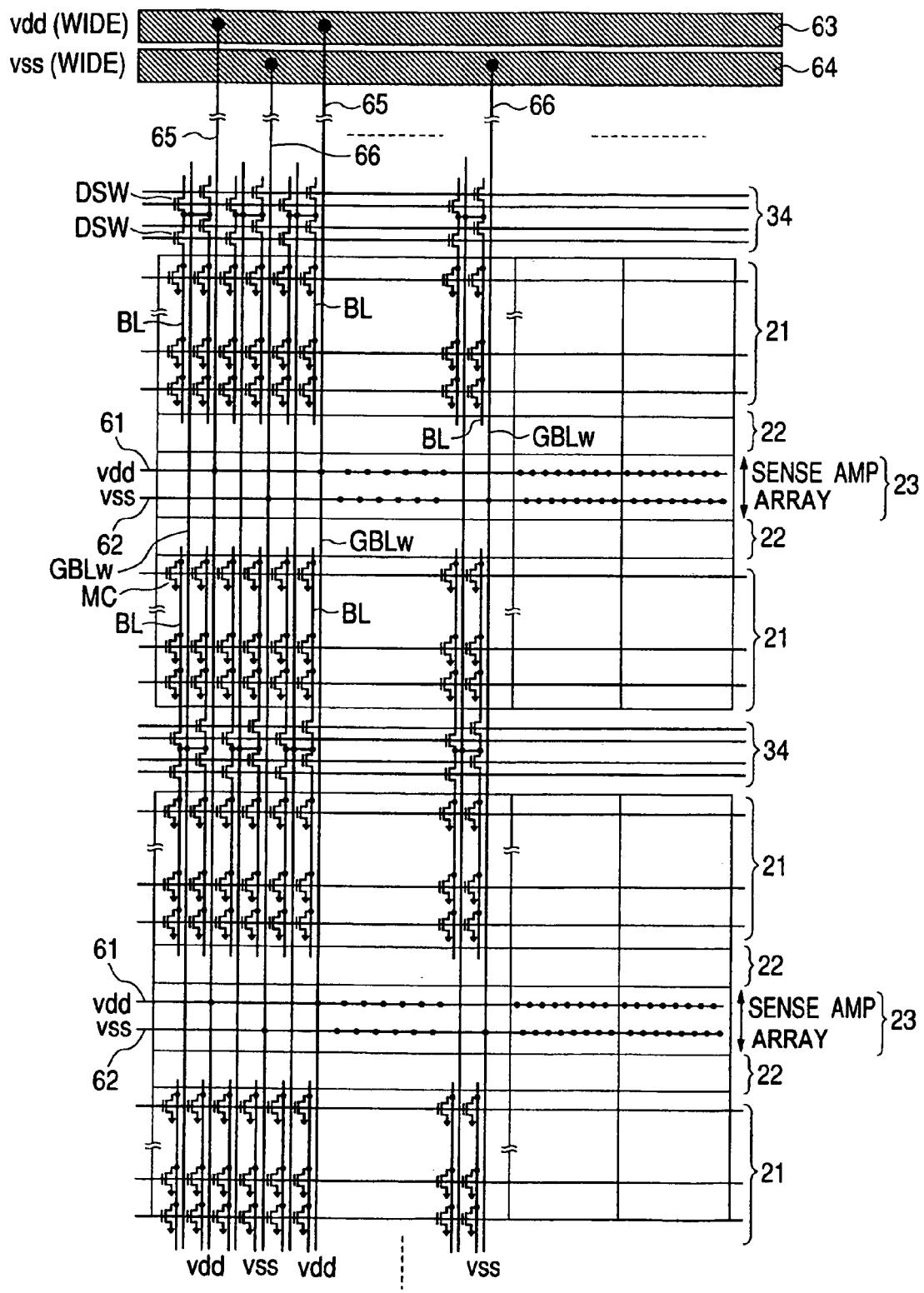
FIG. 9 is an explanatory view illustrating a power source wiring layout of sense amp arrays.

FIG. 9 illustrates a power source wiring layout of the sense amp arrays. By the hierarchal memory arrays 21 described in FIGS. 2 and 5, the sense amp arrays 23 are distributed in the parallel direction of the memory arrays 21. Narrow individual power source wires (first power source wires) (vdd) 61, (vss) 62 are provided along the sense amp SA array direction for every plural sense amp arrays 23. Shared power source wires (second power source wires) vdd (WIDE)63, vss (WIDE)64 wider than the individual power source wires 61, 62 are provided in positions spaced from the individual power source wires 61, 62. The respective individual power source wires 61, 62 are connected to the shared power source wires 63, 64 in a plurality of positions by connection power source wires (third power source wires) (vdd) 65, (vss) 66 provided in the bit line BL direction. In particular, in this example, one write bit line GBLw is provided for two bit lines in each of the memory arrays, and the disconnect switch DSW selects to which bit line is connected. One write bit line GBLw does not correspond to one bit line BL in each of the memory arrays. In other words, when the number of parallel write bits is decided to be 1024, there is employed a layout in which the number of memory cells arrayed in the word line direction is doubled and the number of word lines can be reduced by that in order to obtain a necessary storage capacity. Focusing on this, each of the connection power source wires 65, 66 is arranged between every two bit lines BL to minimize the increased chip occupation area of the connection power source wires 65, 66.

The power source wires 61, 63 and 65 are intended for the source voltage Vdd. The power source wires 62, 64 and 66 are intended for the ground voltage Vss of the circuit. The individual power source wires 61, 62 and the connection power source wires 65, 66 are power source wires of 0.24 μm. The shared power source wires 63, 64 are wide power source wires of 10 μm.

In the power source wiring layout, the operation voltages are not supplied to the respective sense amp arrays 23 from one end side in the array direction. The operation voltages Vdd, Vss are supplied thereto in parallel from a large number of connection power source wires 65, 66 crossing in the array direction. When a large number of sense amps SA are operated in parallel, potential change due to current concentration is difficult to occur. This is easily understood by focusing on the number of connection power source wires 65, 66. Each of the numbers of connection power source wires 65, 66 is the number of half of the number of the write bit lines GBLw, and is 512 according to the example of the number of parallel write bits of 1024. The width of each of the connection power source wires 65, 66 is 512×0.24 μm=122.88 μm.

A large number of wide individual power source wires of 10 μm for source voltage and ground voltage need not be arrayed in each of the sense amp arrays 23 to be spaced. It is possible to prevent the increased chip occupation area due to the power source wires of the sense amps in proportion to the number of sense amp arrays 23.

Figure 10:
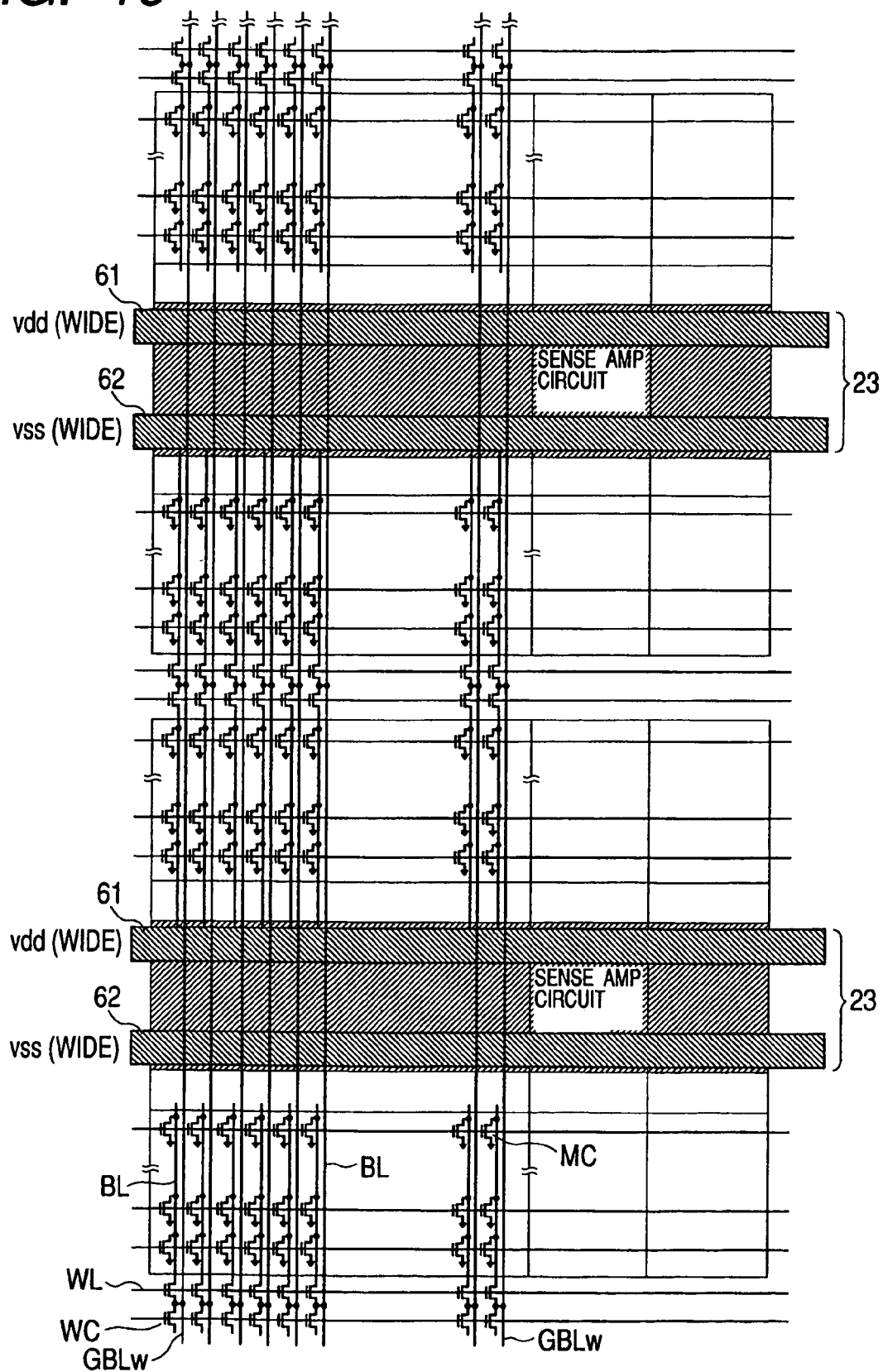
FIG. 10 is an explanatory view showing a comparison example of the sense amp power source layout.

FIG. 10 shows a comparison example of the sense amp power source layout. The individual power source wires 61, 62 for each of the sense amp arrays 23 are connected to power source branch lines, not shown, at both ends. A power source is supplied from both ends of the power source wires 61, 62. When a plurality of sense amps SA are operated in parallel, current concentration occurs. The wire width of the individual power source wires 61, 62 must be increased to some degree to suppress noise. In the example of FIG. 10, the width of the individual power source wires 61 (for the source voltage Vdd) and 62 (for the ground voltage Vss of the circuit) of each of the sense amp arrays 23 is increased. For example, the wire width of each of the individual power source wires 61, 62 are 10 μmm. For example, a layout width of 50 μm of the column selector circuit 22 and the sense amp array 23 is required. When this is performed for each of the sense amp arrays 23, the chip occupation area of the nonvolatile memory is increased. When eight blocks of the selector circuits 22 and the sense amp arrays 23 are arranged in the memory mat 20, the width of the individual power source wires 61, 62 of the sense amp arrays needs 160 μm. In the example of FIG. 9, the wire width of the shared power source wires 63, 64 is about 20 μm. In the example of FIG. 10, one write bit line GBLw is arranged for one bit line BL in each of the memory arrays.

<Parallel Access>

Figure 11:
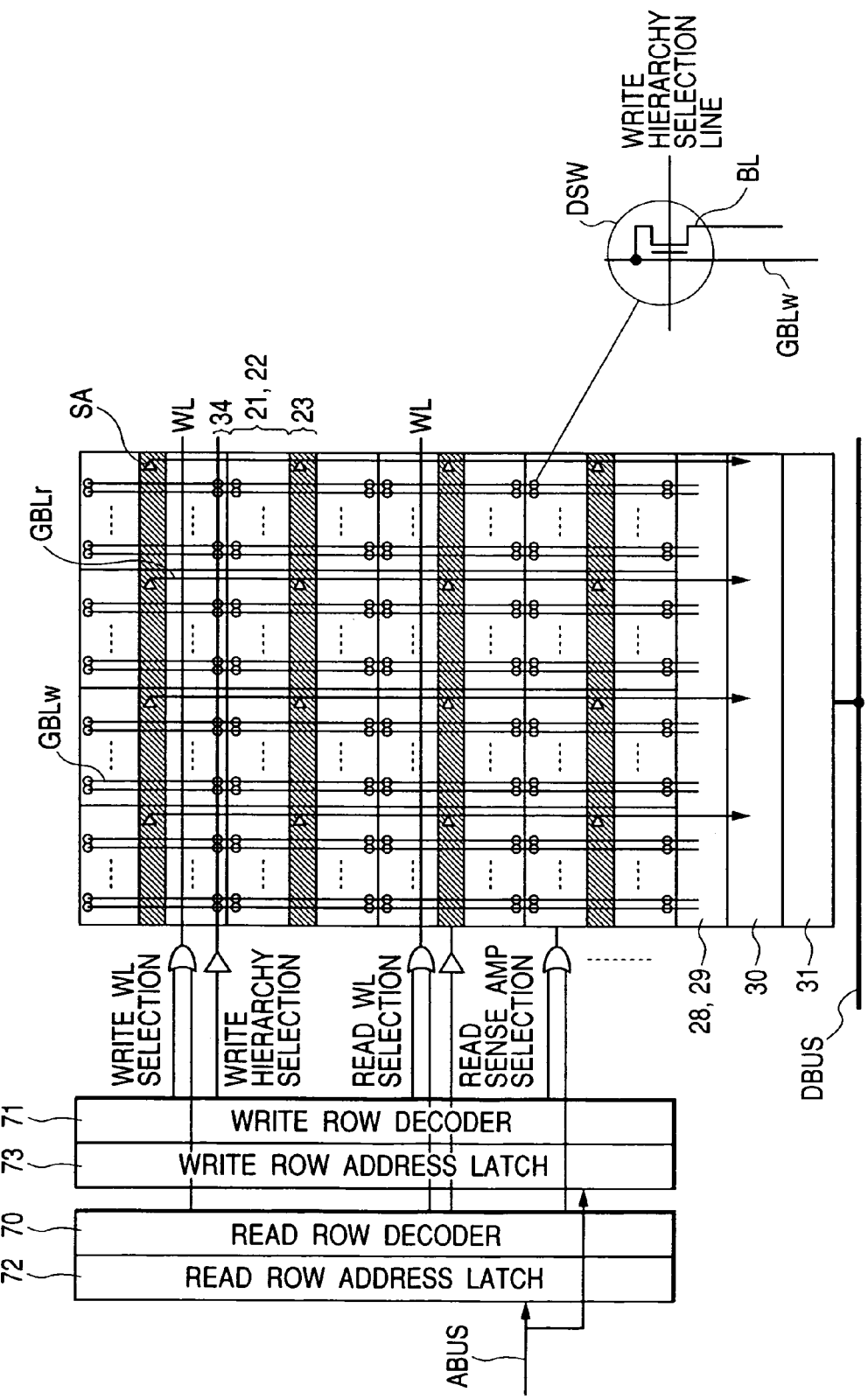
FIG. 11 is an explanatory view conceptually showing the structure of row decoders enabling a read operation and an erase or write operation in the same cycle.

The flash memory 9 explained in FIGS. 2 and 4 separately has the read main bit line GBLr for read and the write bit line GBLw for write. The disconnect switch DSW of the memory array 21 to be read in a read operation disconnects the write bit line GBLw from the bit line BL. A read operation and erase and write operations can be performed in parallel to the different memory arrays 21. In order to perform the erase and write operations in the same cycle, as illustrated in FIG. 11, the flash memory separately has a row decoder for read 70 selecting the operation of the word line WL (READ WL SELECTION), the disconnect switch DSW and the sense amp SA in a read operation (READ SENSE AMP SELECTION), and a row decoder for write (a second address decoder) 71 selecting the operation of the word line WL (WRITE WL SELECTION) and the disconnect switch DSW (WRITE HIERARCHY SELECTION) in a write operation. Address latches 72, 73 are arranged at the previous stages of the decoders 70, 71, respectively. The row decoder for read 70 and the column decoder CDEC means a first address decoder.

Figure 12:
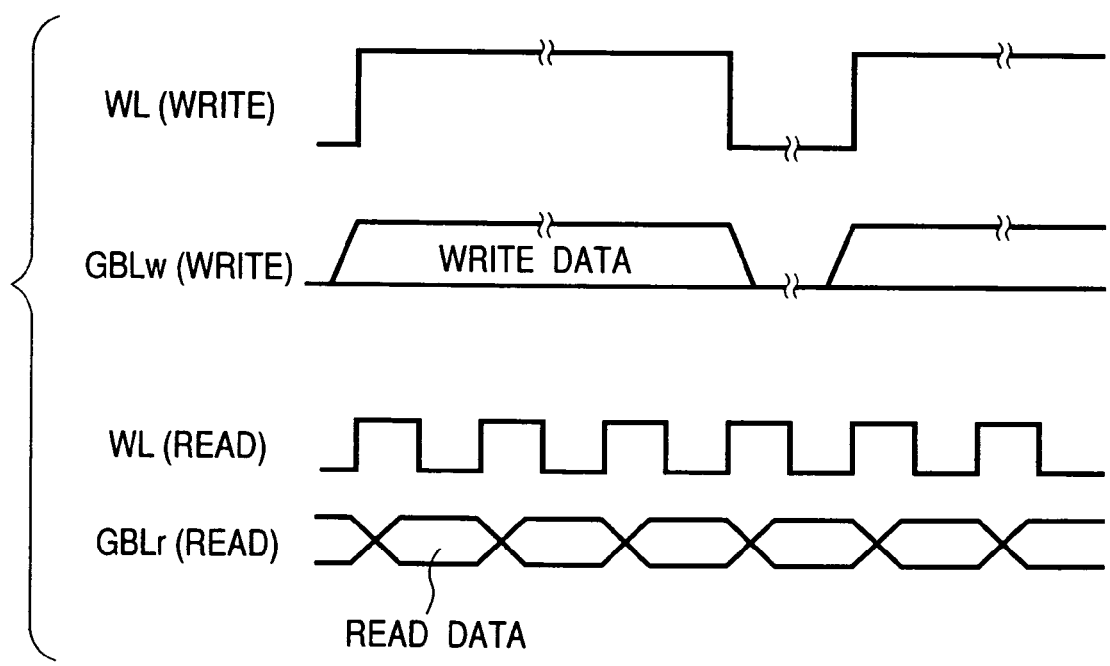
FIG. 12 is a timing chart illustrating operation timings of write and read processing to memory arrays different from each other.
Figure 13:
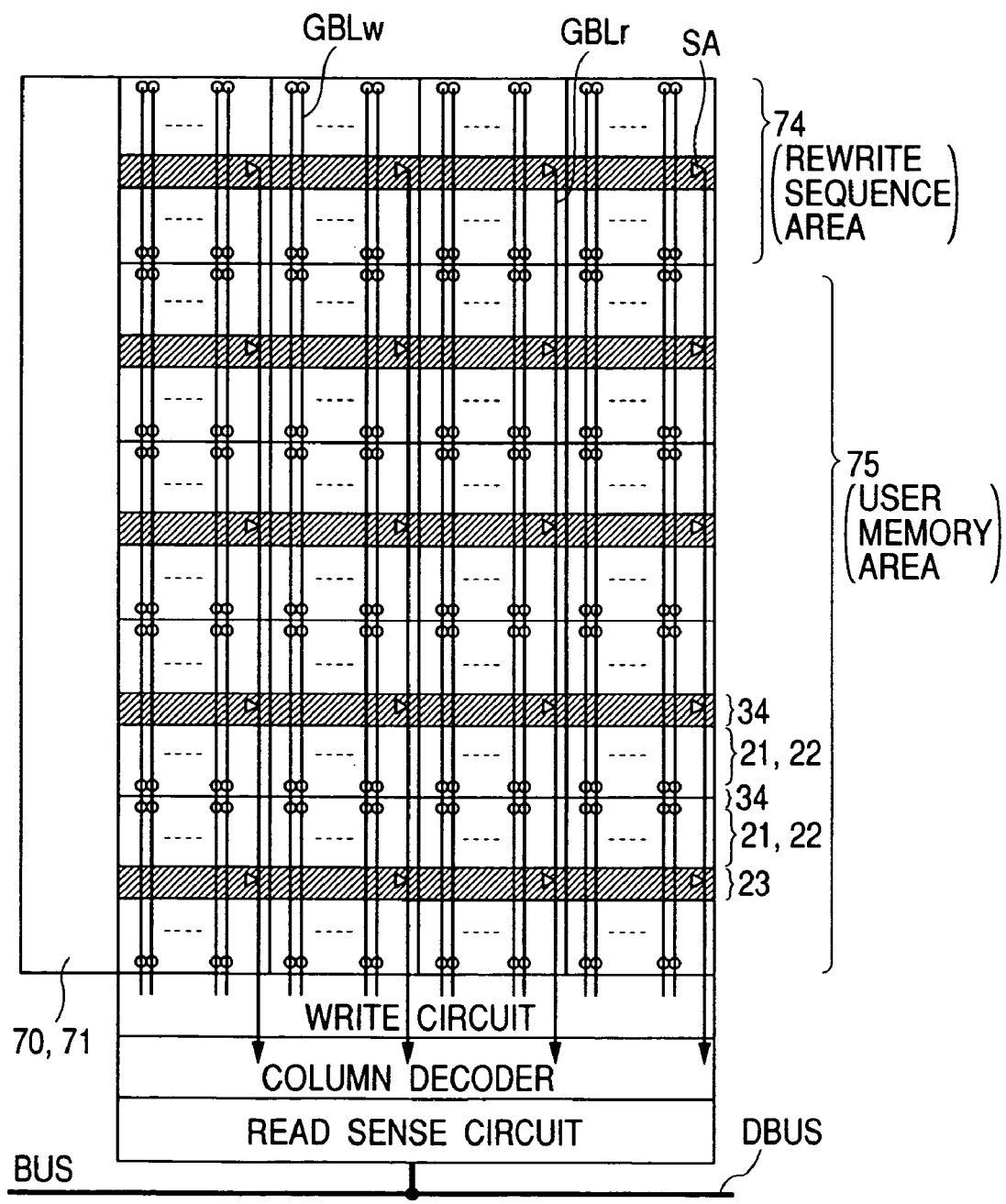
FIG. 13 is an explanatory view showing an application example of the flash memory of FIG. 11.
Figure 14:
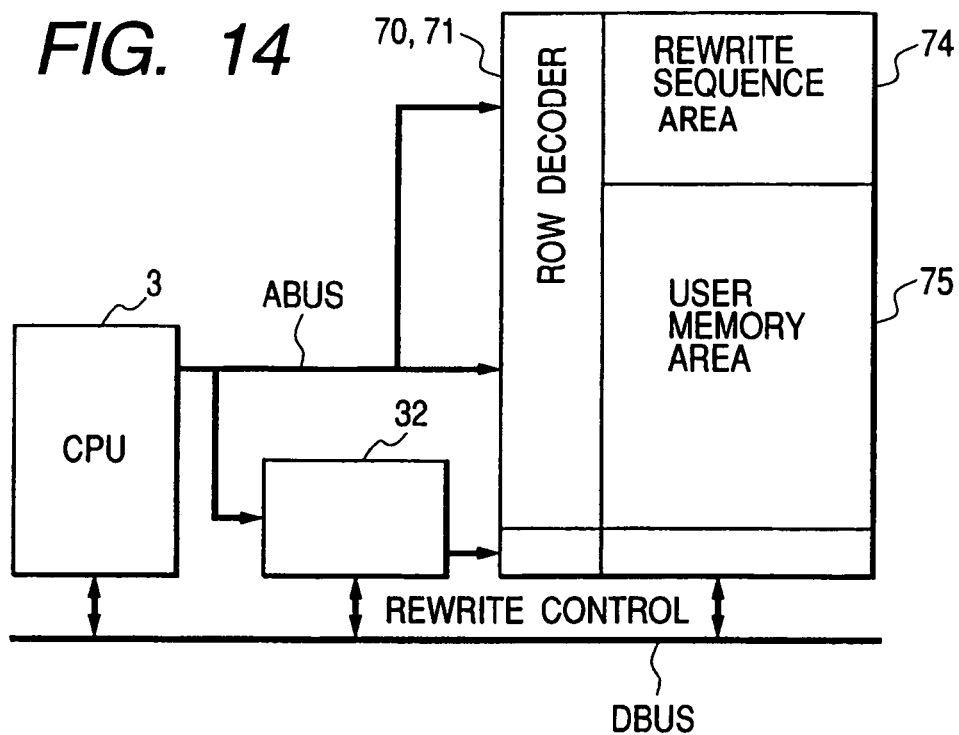
FIG. 14 is an explanatory view of an operation using the flash memory of FIG. 11.
Figure 15:
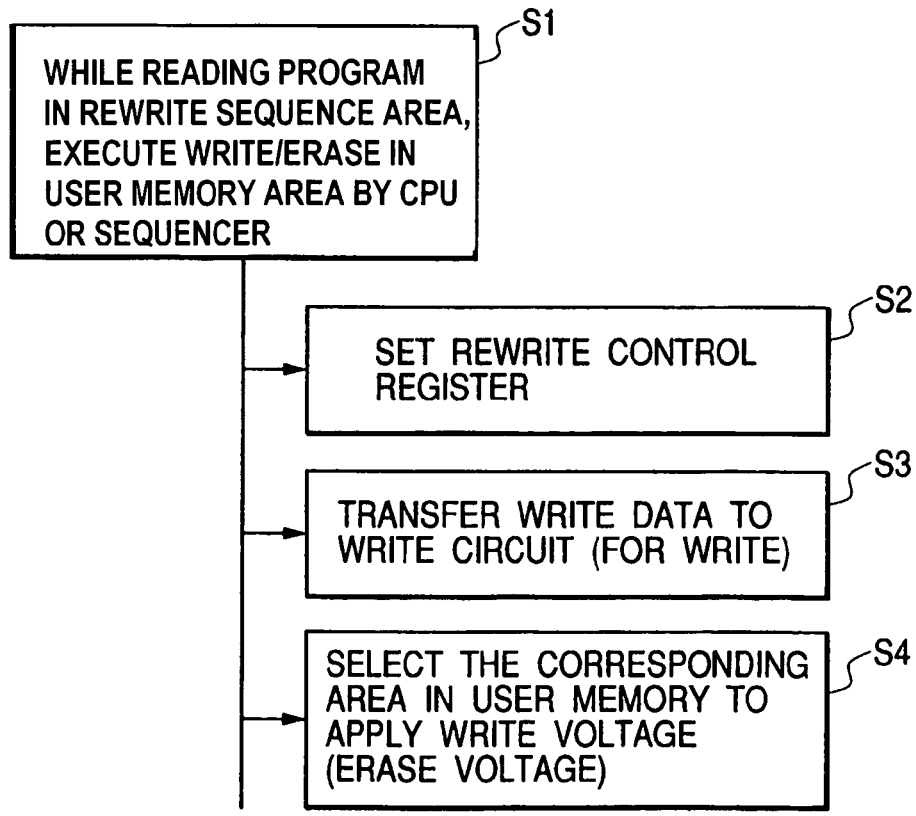
FIG. 15 is a flowchart illustrating a rewrite control procedure using the flash memory of FIG. 11.

FIG. 12 illustrates operation timings of write processing and read processing to memory arrays different from each other. In FIG. 12, signal WL(WRITE) is the word line in a write operation, signal GBLw(WRITE) is the write bit line (reference FIG. 2), signal WL(READ) is the word line in a read operation, and signal GBLw(READ) is the read main bit line. FIG. 13 illustrates an application example of the flash memory of FIG. 11. The memory arrays of part of the memory mat 20 are a storage area (rewrite sequence area) 74 storing a rewrite sequence program of the flash memory and the remaining memory arrays are a storage area (user memory area) 75 which can be freely rewritten by the user. As explained based on FIG. 11, the hierarchal bit line structure realizing the hierarchal sense method is disconnected from the write bit line structure to perform write and read in parallel in the same memory cycle. While reading and executing the rewrite sequence program, the memory of the user area can be rewritten. As illustrated in FIG. 14, a command for rewrite control is fetched directly from the rewrite sequence area 74 to perform rewrite to the user memory area 75 based on it (S1 of FIG. 15). FIG. 15 illustrates a rewrite control procedure. The CPU 3 fetches the command for rewrite control directly from the rewrite sequence area 74 to set control data to a rewrite control register of the control circuit 32 based on it (S2). For write, the CPU 3 transfers write data to the flash memory 9 (S3). The flash memory 9 selects a predetermined area of the user memory area 75 by an address signal. For write, a write voltage is applied, and for erase, an erase voltage is applied (S4).

The rewrite sequence program need not be transferred to the RAM 4 to fetch the command from the RAM 4 for controlling rewrite. This can save transfer time of the rewrite sequence program having a relatively large program capacity and can mount the flash memory 9 over a semiconductor integrated circuit not incorporating the RAM to perform rewrite by CPU control.

<Pipeline Access>

Figure 16:
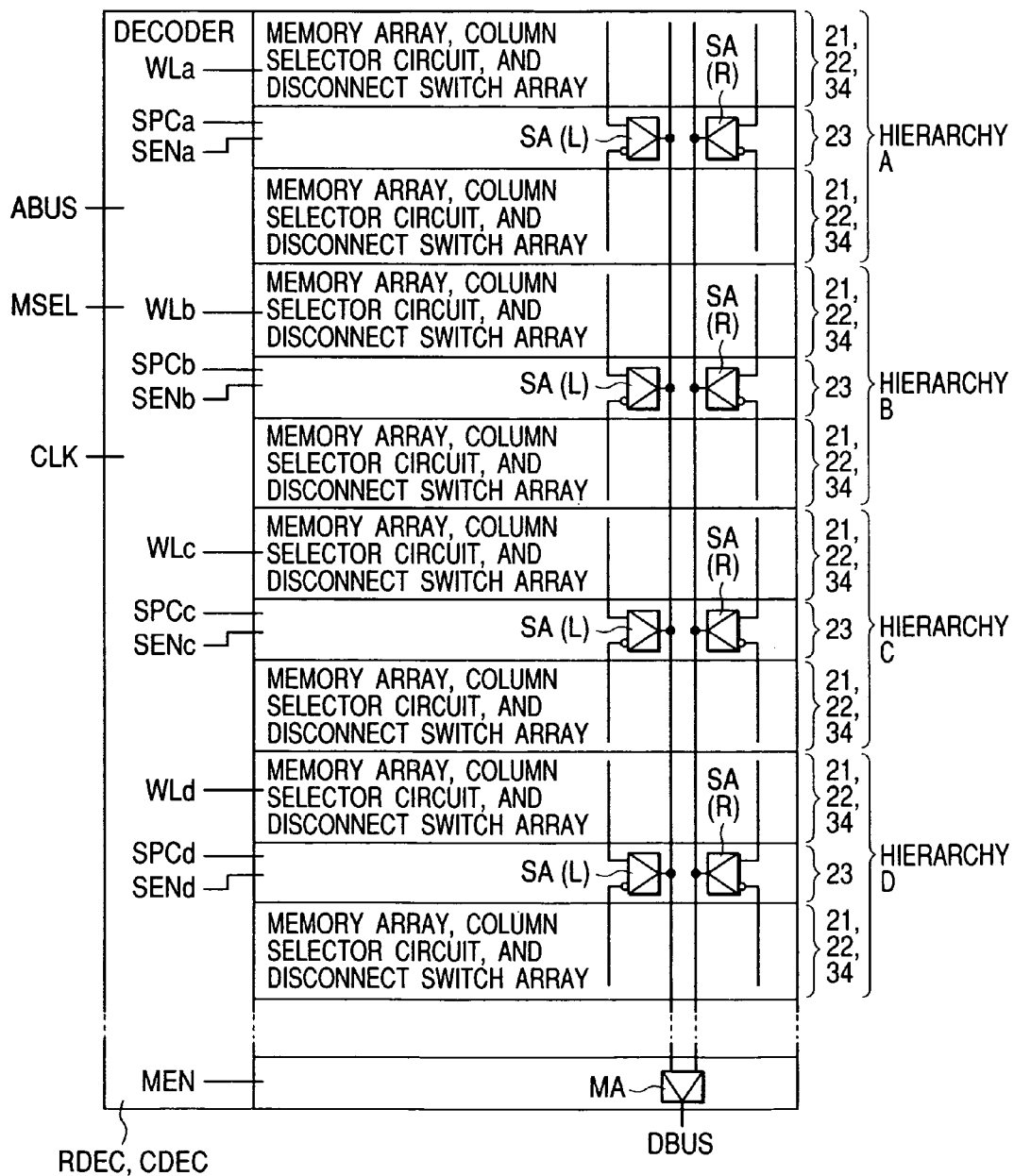
FIG. 16 is a schematic block diagram of the flash memory when realizing a first pipeline access form.

The flash memory 9 explained in FIGS. 2, 4 and 5 can perform a read operation in parallel for each memory array in the memory array to the sense amp by the hierarchal bit line structure having the sense amp array 23 interposed therein. Focusing on this, in the pipeline access, the first and second address decoders employ address code logic performing address mapping so that the memory arrays sharing the sense amp are different to consecutive addresses. When sequentially accessing the adjacent data in access units, the different memory arrays are successively selected. In FIG. 16, when the memory mat is grasped as hierarchies A to D, the physical addresses of the memory cell are repeatedly arranged in the order of hierarchies A, B, C and D. In FIG. 16, for each of the hierarchies A, B, C and D, suffixes a, b, c or d is given to the word lines WL, the precharge signals SPC (L) and SPC(R), and the sense amp enable signals SEN (L) and SEN(R), which are representatively shown. The decoder shown in FIG. 16 is a generic term for the row decoder RDEC and the column decoder CDEC.

Figure 17:
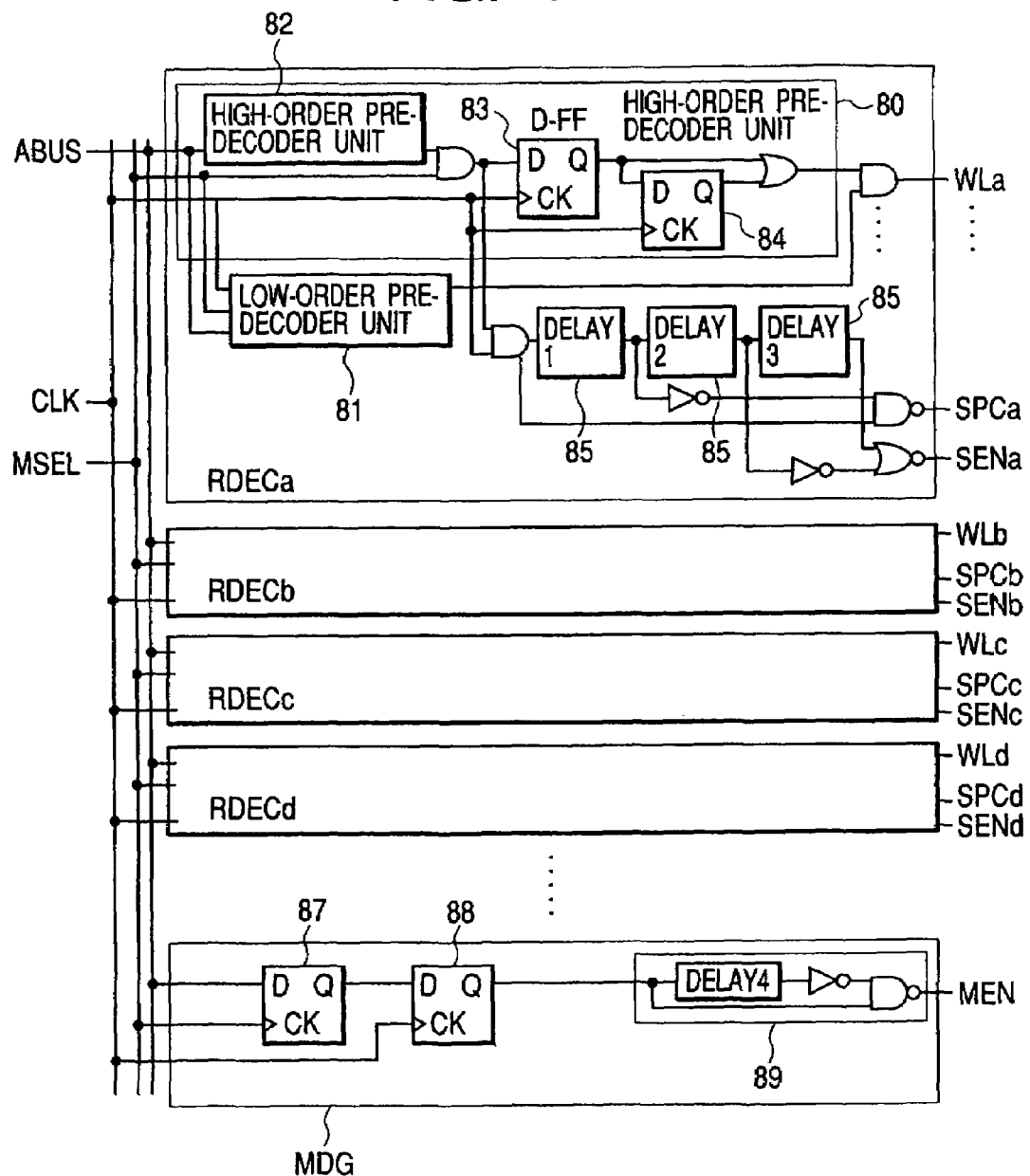
FIG. 17 is a logic circuit diagram of a decoder employed for the flash memory when realizing the first pipeline access form.
Figure 18:
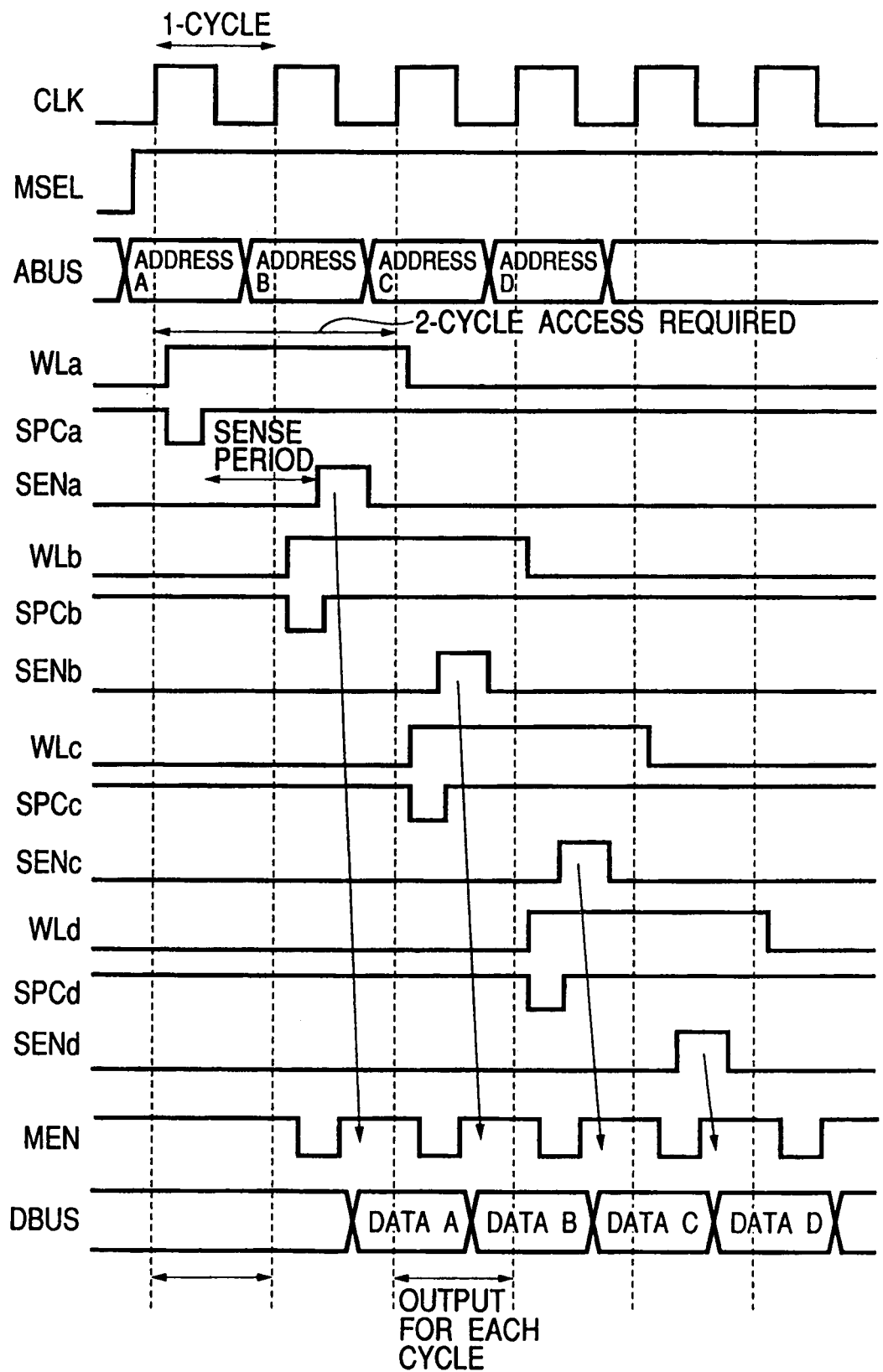
FIG. 18 is a timing chart of a pipeline read operation of the first pipeline access form.

FIGS. 16 to 18 are diagrams of assistance in explaining a first pipeline access form assuming the address mapping. FIG. 16 is a schematic block diagram of the flash memory when realizing the first pipeline access form. In FIG. 16, SA(L) and SA(R) refer to sense amps. FIG. 17 is a logic circuit diagram of the decoder. FIG. 18 is a timing chart of a pipeline read operation. In FIGS. 16–18, WLa, WLb, WLc, and WLd are word lines; SPCa, SPCb, SPCc, SPCd, SENa, SENb, SENc, and SENd are sense amp control lines.

In the first pipeline access form, in a read operation, the row decoder (RDEC) 25 explained in FIG. 2 responds to the change of an address signal to hold an address decode signal for each of the corresponding memory arrays by the number of cycles necessary for the read operation, and responds to the change of the address signal to operate the sense amp with delay. The column decoder (CDEC) 26 is the same as a normal read operation and selects the bit line by the memory mat on the selected word line side based on the decode result of the row decoder. At least, the selection period is overlapped with the sense amp driving period.

As illustrated in FIG. 18, in the case of two read cycles 2-CYCLE ACCESS REQUIRED of a clock signal 1-CYCLE, while changing an address signal for each cycle, data A, B, C and D of consecutive addresses A, B, C and D can be sequentially read OUTPUT FOR EACH CYCLE.

The logic of the row decoder RDEC for performing such pipeline access is as illustrated in FIG. 17. The row decoder RDECa (meaning the row decoder RDEC of the hierarchy A) whose detail is shown decides a read accessed hierarchy by a high-order pre-decoder unit 80 and decides the accessed word line in the hierarchy by the low-order pre-decoder unit so that an AND signal to both outputs is a select signal of the word line WLa. Both of the pre-decoder units 80, 81 basically have the same construction. As in the high-order pre-decoder unit 80 whose detail is representatively shown, the decode result of a pre-decoder 82 decoding a high-order address is held by latch circuits 83, 84 in two cycles of clock signal CLK for output. The pre-decoder of the low-order pre-decoder unit 81 decodes a low-order address. The precharge signal SCPa and the sense amp activating signal SENa are generated by timing adjusting the decode result signal of the pre-decoder 82 of the high-order pre-decoder 80 using three delay circuits (DELAY 1~3) 85. Other row decoders RDECb, RDECc and RDECd are similarly constructed. Signal generation circuit MDG generating the activating control signal MEN of the main amp MA has two latch circuits 87, 88 in series latching module select signal MSEL selecting the read operation of the flash memory in synchronization with the clock signal CLK, and a pulse generation circuit 89 generating a pulse based on the output change of the last latch circuit 88.

Figure 19:
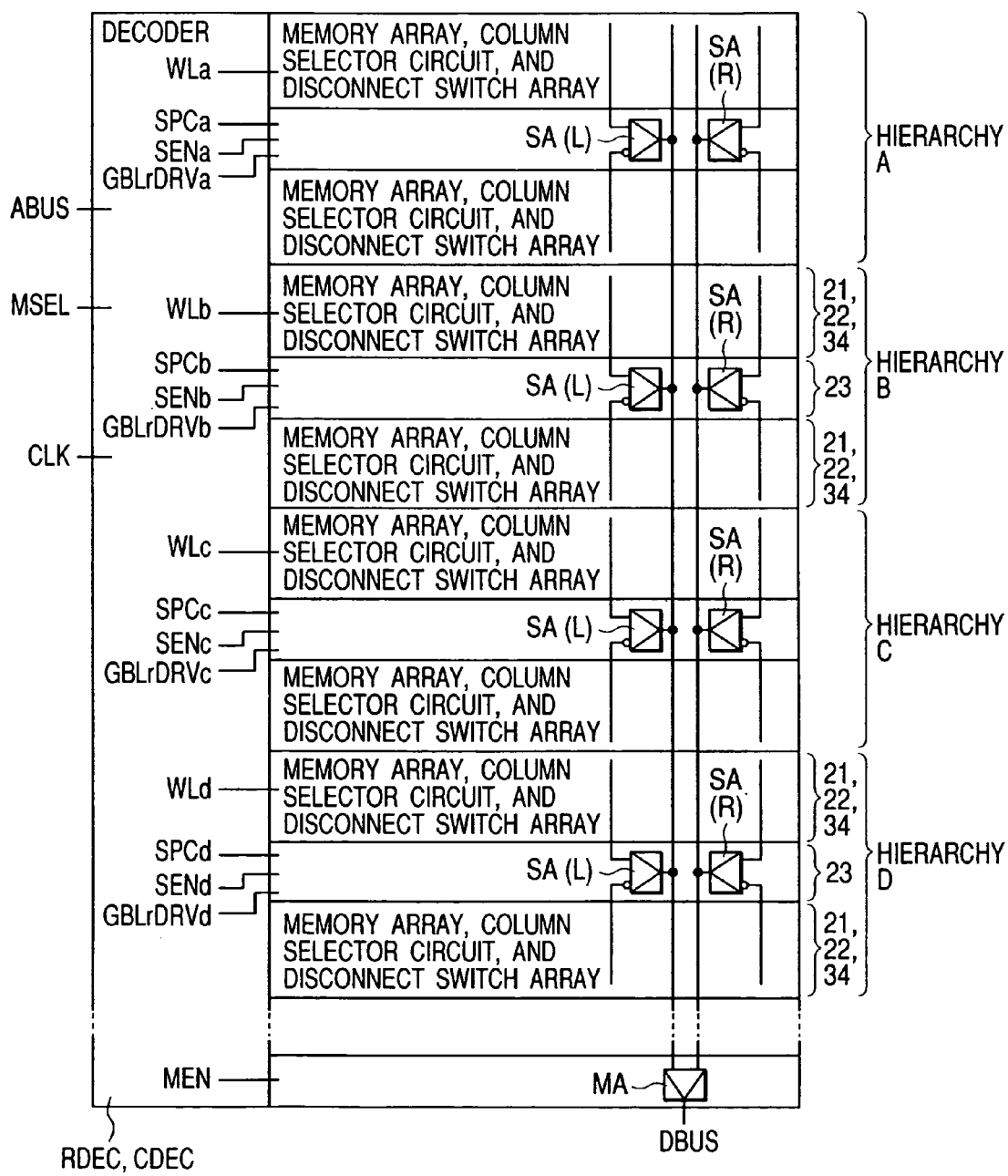
FIG. 19 is a schematic block diagram of a flash memory when realizing a second pipeline access form.
Figure 20:
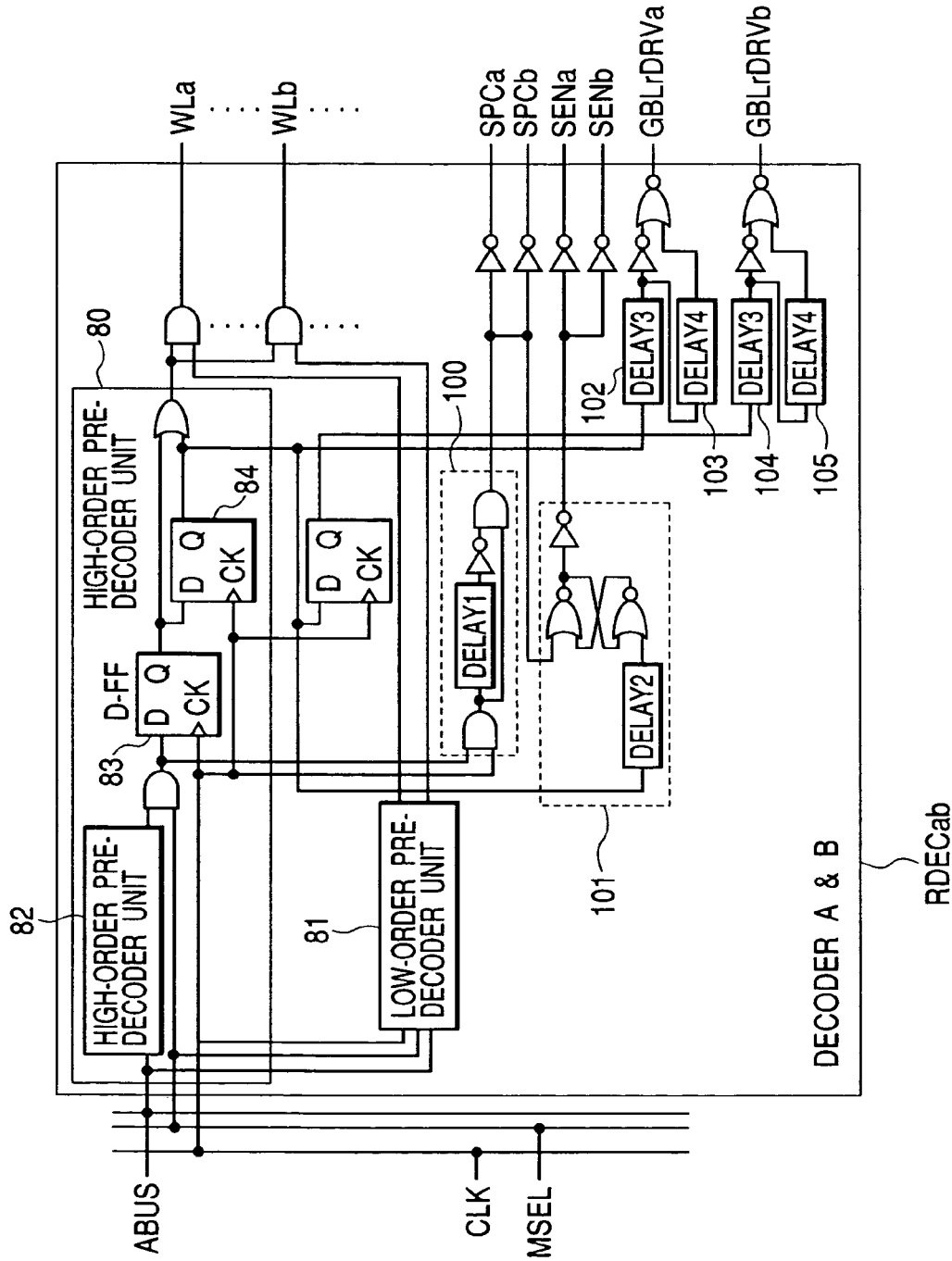
FIG. 20 is a logic circuit diagram of a decoder employed for the flash memory when realizing the second pipeline access form.
Figure 21:
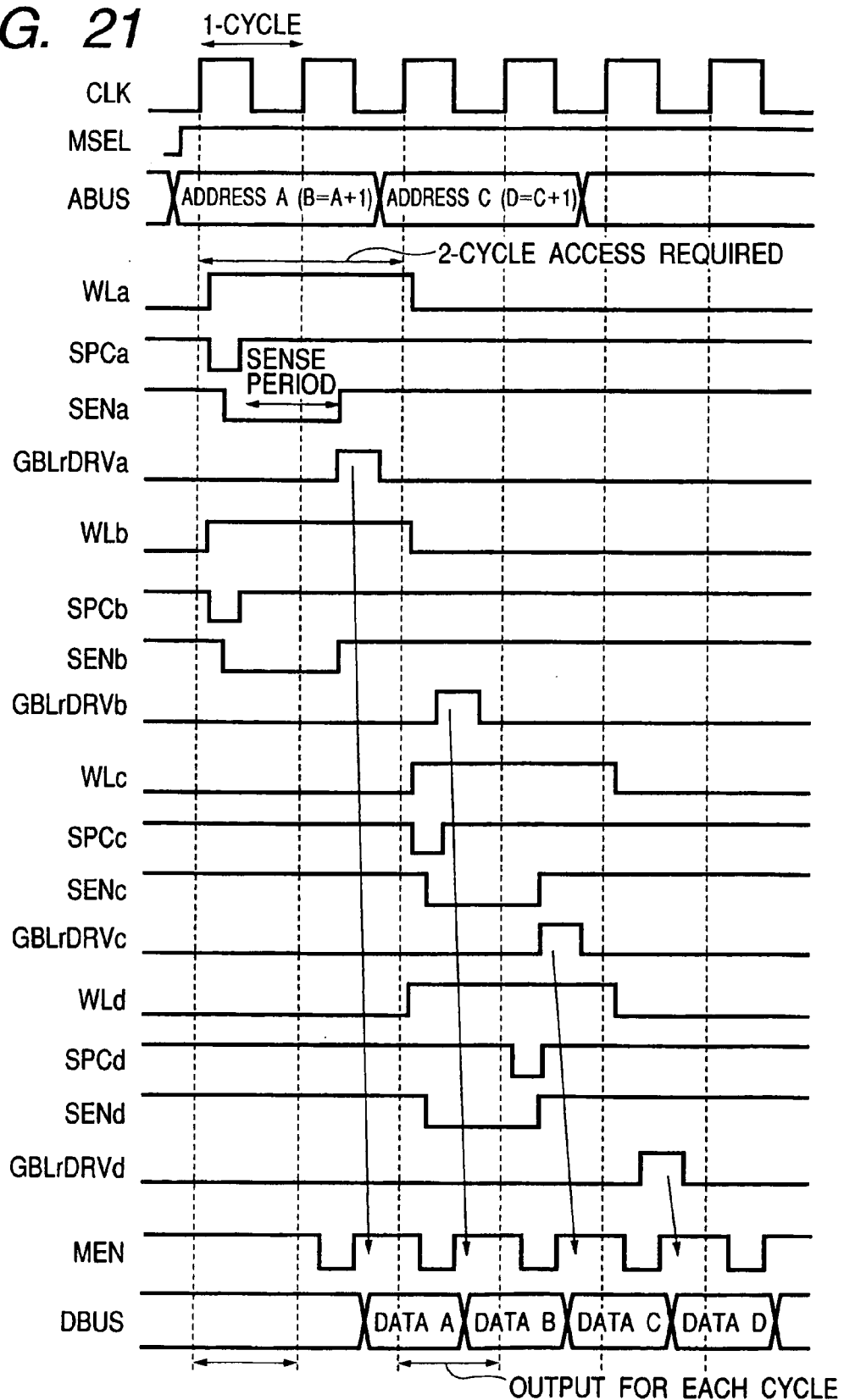
FIG. 21 is a timing chart of a pipeline read operation of the second pipeline access form.

FIGS. 19 to 21 are diagrams of assistance in explaining a second pipeline access form assuming the address mapping. FIG. 19 is a schematic block diagram of a flash memory when realizing the second pipeline access form. FIG. 20 is a logic circuit diagram of the decoder. In FIG. 20, RDECab is a decoder. FIG. 21 is a timing chart of a pipeline read operation. In the flash memory realizing the second pipeline access form, the sense amp SA must employ the structure of FIG. 22 in place of FIG. 6.

In FIG. 19, for each of the hierarchies A, B, C and D, suffixes a, b, c or d is given to the word line WL, the precharge signal SPC, the sense amp enable signal SEN and the read main bit line drive signal GBLrDRV, which are representatively shown; that is, GBLrDRVa, GBLrDRVb, GBLrDRVc, and GBLrDRVd are read main bit line drive signals; WLa, WLb, WLc, and WLd are word lines; and SPCa, SPCb, SPCc, SPCd, SENa, SENb, SENc, and SENd are sense amp control lines for the respective hierarchies A, B, C and D. The decoder shown in FIG. 19 is a generic term for the row decoder RDEC and the column decoder CDEC. SA(L) and SA(R) refer to sense amps.

In the second pipeline access form, in a read operation, the row decoder (RDEC) 25 explained in FIG. 2 selects, in parallel, both word lines of an address specified by an address signal and the next address, and sequentially drive controls the driving of the second bit line of the respective sense amps corresponding to the specified address and the next address. The column decoder (CDEC) 26 selects the bit line in the memory mat on the selected word line side based on the decode result of the row decoder 25. At least, the selection period is overlapped with the sense amp drive period. The word lines of the sequential addresses are selected in parallel. In response to this, the bit lines are also selected in parallel in the respective memory arrays.

As illustrated in FIG. 21, in the case of two read cycles 2-cycle access required of the clock signal 1-cycle, when the address A is specified in the first memory cycle and the address C is specified in the next memory cycle, word line selection, bit line selection and sense amp driving are performed in the memory mat of the address A in the first memory cycle (CLK 2 cycles). In parallel with it, word line selection, bit line selection and sense amp driving are performed in the memory mat of the address B. In the next memory cycle (CLK 2 cycles), word line selection, bit line selection and sense amp driving are performed in the memory mat of the address C. In parallel with it, word line selection, bit line selection and sense amp driving are performed in the memory mat of the address D. The outputs of the sense amps SA of the four memory arrays are performed in series in the order of the data A, B, C and D.

Figure 22:
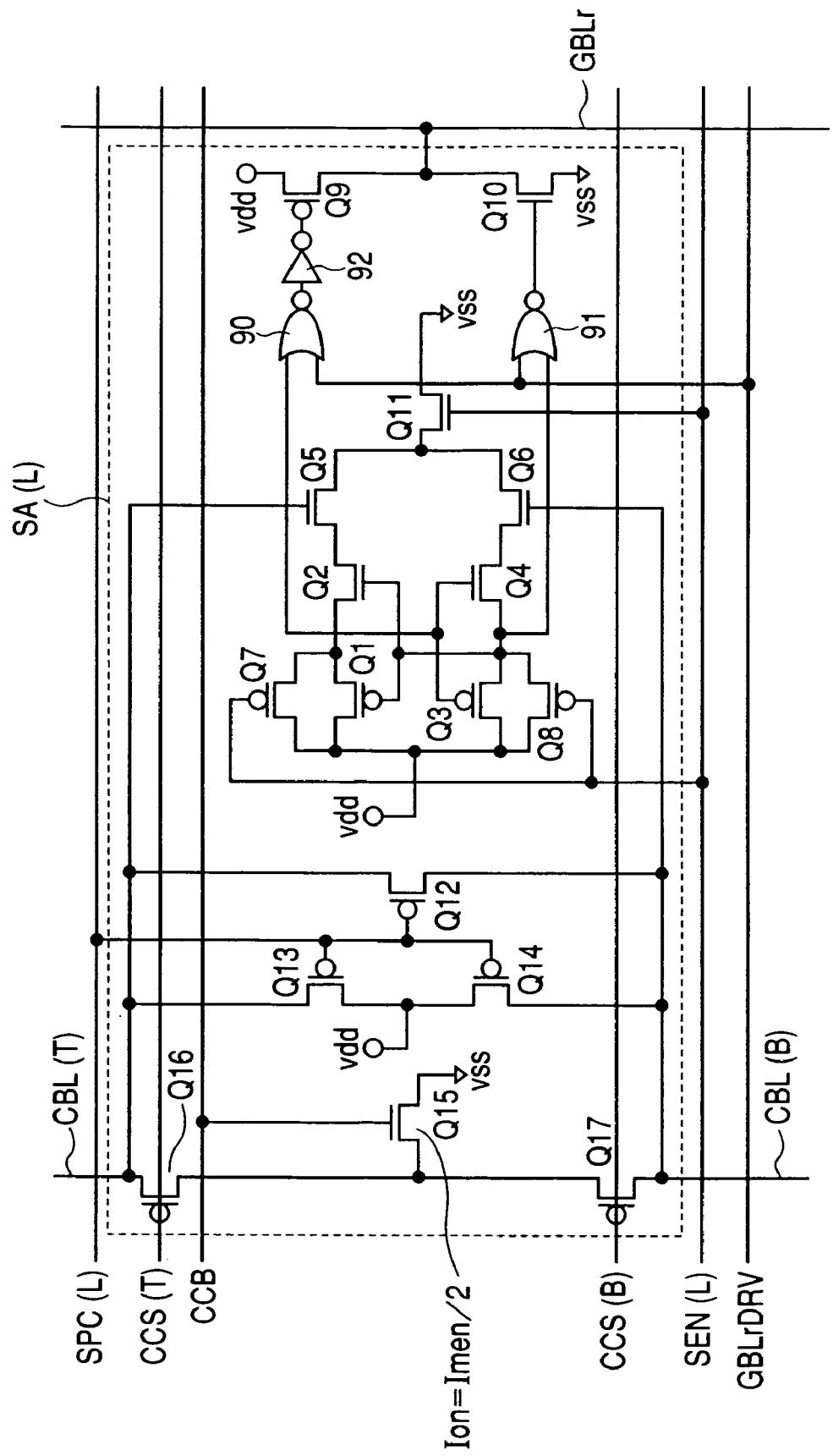
FIG. 22 is a circuit diagram of the sense amp employed in place of FIG. 6 when realizing the second pipeline access form.

The structure of the sense amp SA for performing such pipeline access is as illustrated in FIG. 22. In order to separately control the timings of the sense and output operations, in the structure of FIG. 6, the output operation of the MOS transistors Q9, Q10 is enabled after the read main bit line drive signal GBLrDRV is activated, and OR gates 90, 91 and an inverter 92 are added. In FIG. 22, SA(L) is a sense amp; SPC(L) and SEN(L) are control signals of a sense amp; and CCS(T), CBL(T), CBL(B), CCB, and CCS(B) are input signals of a sense amp.

The logic of the row decoder RDEC for performing the second pipeline access form is as illustrated in FIG. 20. The row decoder RDECab meaning the row decoder RDEC of the hierarchies A and B is illustrated here. The high-order pre-decoder unit 80 and the low-order pre-decoder unit 81 have the same construction as the RDECa and RDECb of FIG. 17. The AND signals of both are select signals of the word lines WLa, WLb. The precharge signals SPCa, SPCb are generated by a pulse generation circuit (including a delay 1) 100 generating a pulse based on the output change of the high-order pre-decoder 82. The sense amp activating signals SENa, SENb are generated by a delay latch circuit 101 inputting the output of the latch circuit 84 and the output of the pulse generation circuit 100. The read main bit line drive signals GBLrDRVa, GBLrDRVb are sequentially activated by successively delaying the output of the latch circuit 84 by delay circuits (DELAY 3 AND 4) 102, 103, 104 and 105.

<Memory Card>

Figure 23:
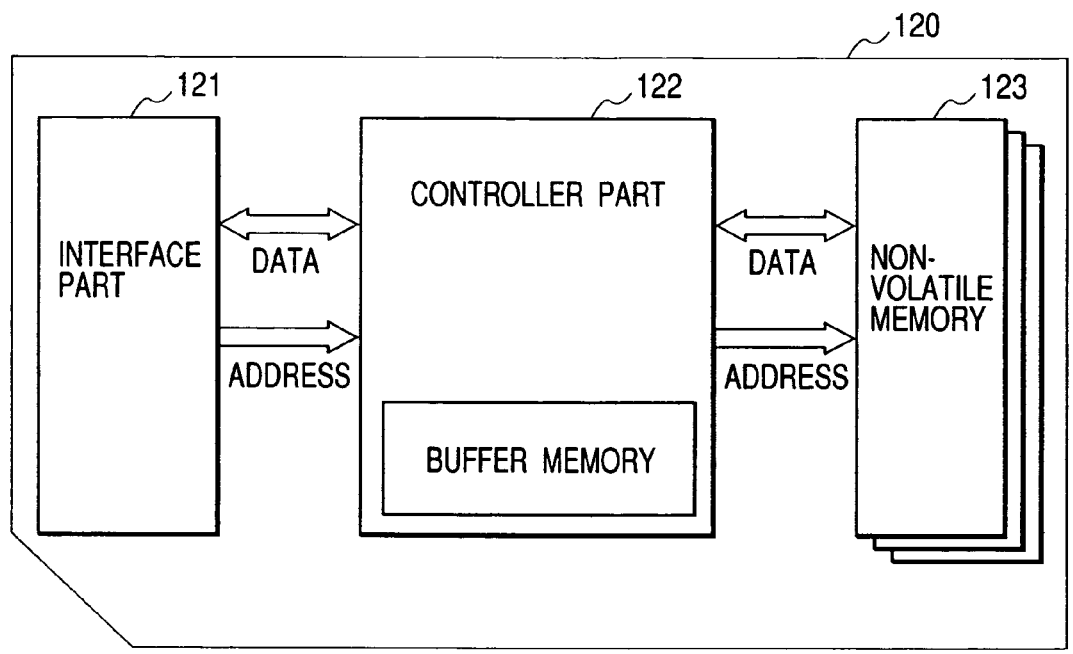
FIG. 23 is a block diagram schematically showing a memory card as an example of a nonvolatile memory device according to the present invention.
Figure 24:
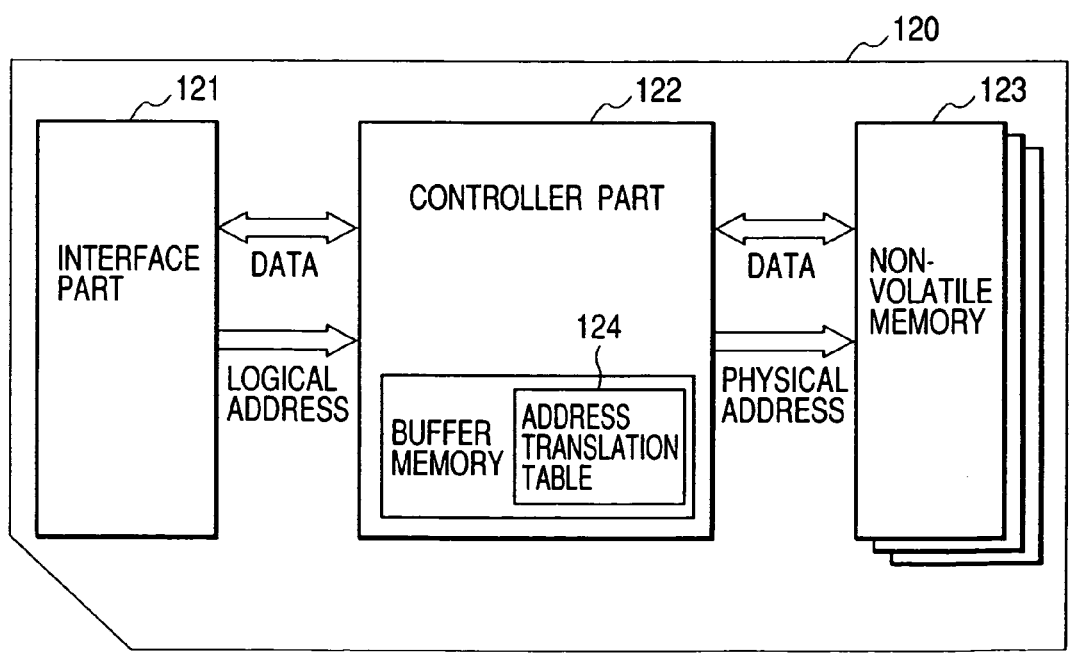
FIG. 24 is a block diagram schematically showing a memory card as another example of the nonvolatile memory device according to the present invention.

FIG. 23 and FIG. 24 shows a schematic diagram of a memory card as an example of the nonvolatile memory device according to the present invention. A memory card 120 has an interface part 121 performing interface with outside, a controller (CONTROLLER PART) 122 having the buffer memory (BUFFER MEMORY) performing operation control of the memory card, and one or more nonvolatile memories 123 of the present invention. The controller 122 couples to the interface part 121 by the data bus (DATA) and the address bus (ADDRESS), and couples to the nonvolatile memory 123 by the data bus (DATA) and the address bus (ADDRESS). As in the flash memory 9 represented by FIG. 5, the nonvolatile memory 123 can perform a read operation in parallel with the write operation in other memory arrays except for a memory array including a memory cell performing write and a memory array in which the sub bit line of the memory array is a reference input of the sense amp. To write and read operation requests from outside, the controller can perform operations to these requests in parallel. As in FIG. 24, in the case of the memory card 120 having an address translation table (ADDRESS TRANSLATION TABLE) 124 of an address logical address (LOGICAL ADDRESS) inputted from outside and an address (physical address) accessed in the nonvolatile memory, when performing a write operation, new data may be written into an arbitrary physical address (PHYSICAL ADDRESS) to update the address translation table. The memory card 120 having such address translation table 124 can select a physical address so as to provide a memory array capable of performing a write operation in parallel with the memory array including the physical address performing a read operation, perform the read and write operations in parallel, and update the address translation table, thereby shortening turnaround time of the write and read operations in appearance.

<Verify Access>

There will be described an embodiment which focuses on verify read when the write and read operations are performed in parallel by different hierarchies of the memory arrays.

FIGS. 25 to 29 illustrate a first embodiment which can prevent conflict of read data of verify read and read data of a read operation when the write and read operations are performed in parallel in different hierarchies.

Figure 25:
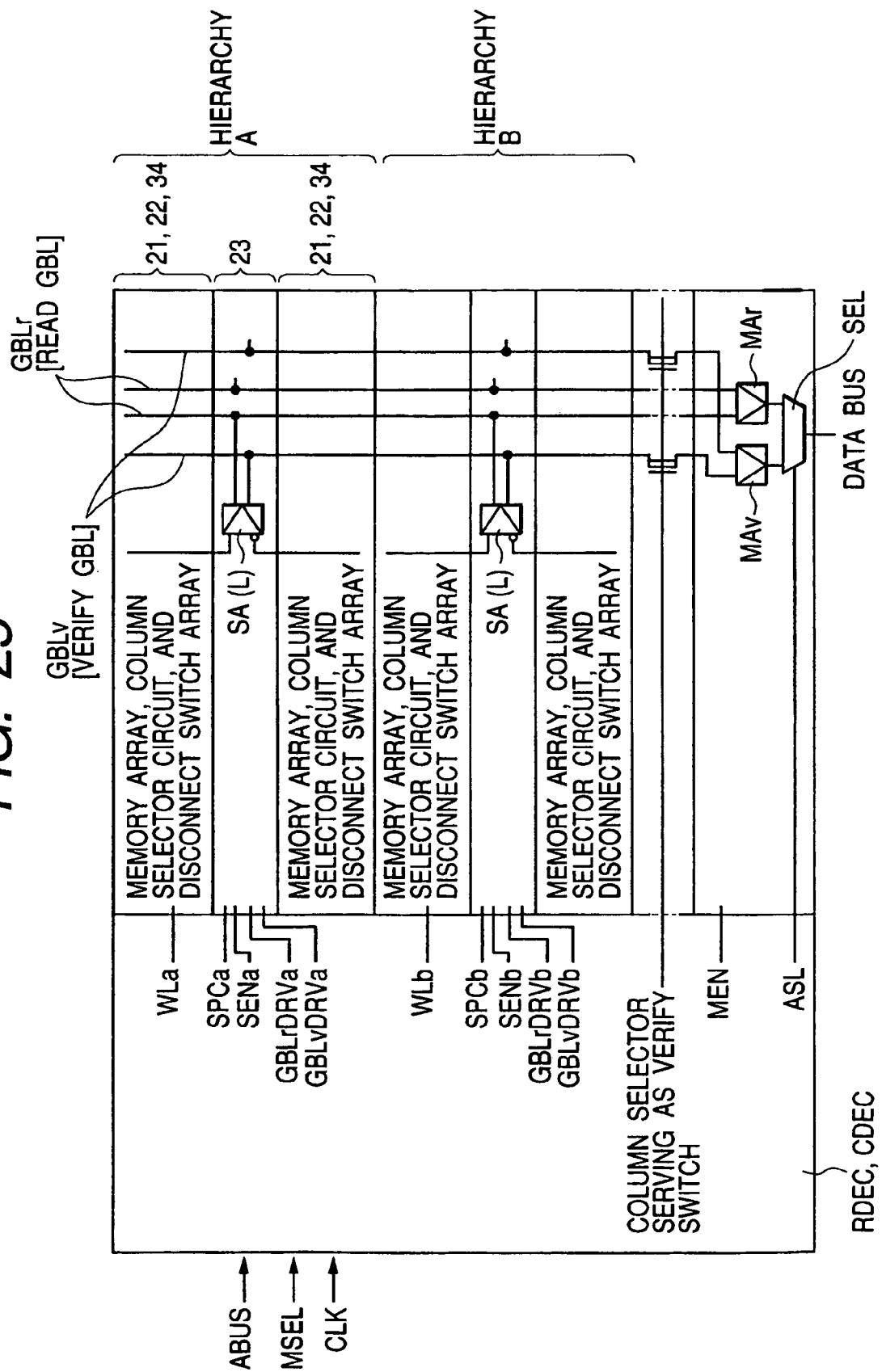
FIG. 25 is a block diagram schematically showing the flash memory when realizing read data conflict prevention.

FIG. 25 schematically shows the flash memory when realizing the read data conflict prevention. The drawing illustrates memory arrays for two hierarchies A, B. The verify main bit lines GBLv are provided corresponding to the read main bit lines GBLr. MAr for read and MAv for verify as the main amps are provided to right and left areas UT. Their outputs are selected by selector SEL. The inputs of the main amp MAr for read are connected to the read main bit lines GBLr of the corresponding right and left areas UT in which one of them is on the sense side and the other is on the reference side. The inputs of the main amp MAv for verify are connected to the main bit lines GBLv for verify of the corresponding right and left areas UT in which one of them is on the sense side and the other is on the reference side. The verify read data is transmitted via the data bus to the CPU, not shown, for comparison. Other constructions are the same as the constructions explained in FIGS. 4 and 5. In FIG. 25, SA(L) is a sense amp and GBLv [VERIFY GBL] and GBLr [READ GBL] are output signals of a sense amp.

Figure 26:
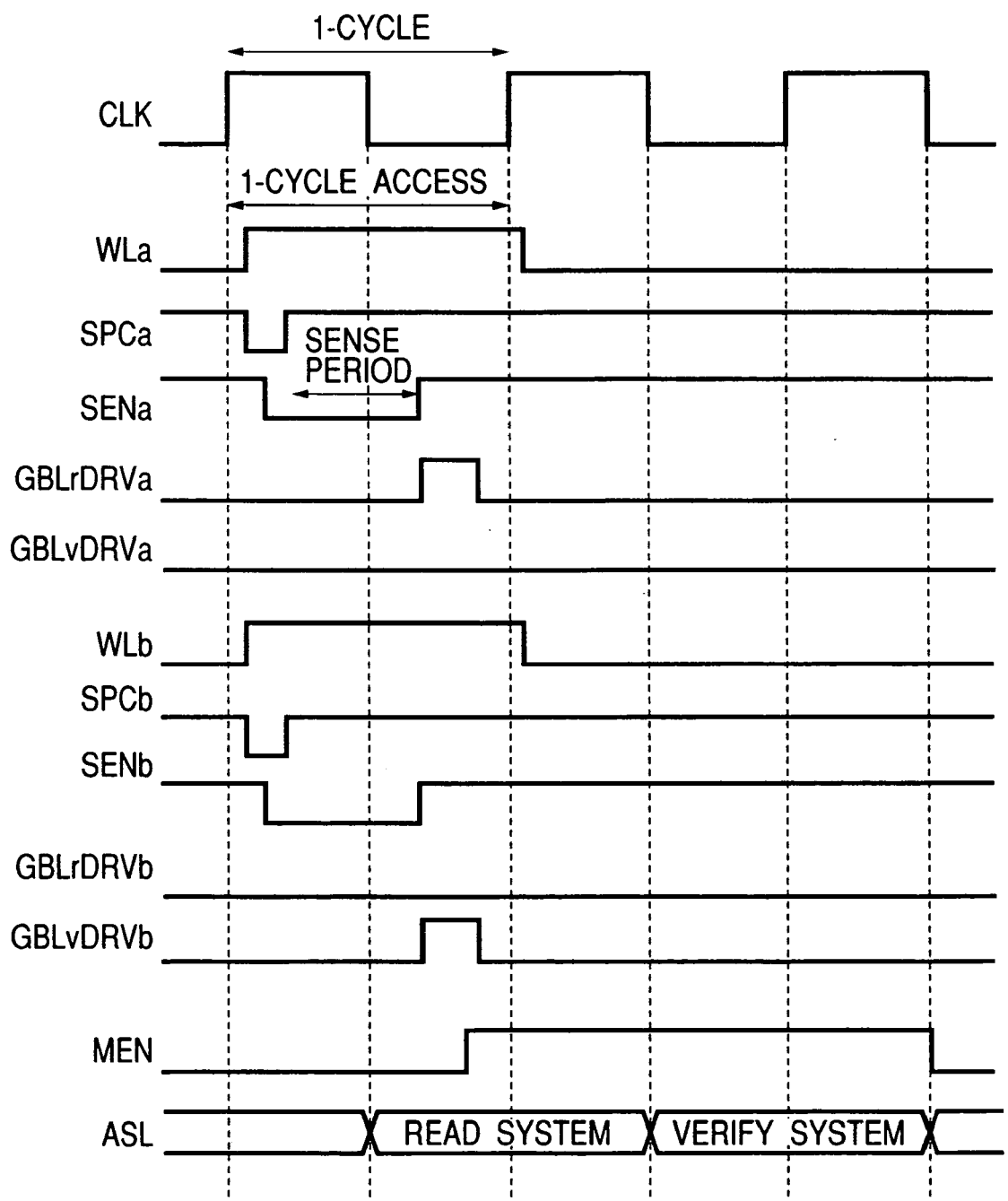
FIG. 26 is an operation timing chart of the flash memory shown in FIG. 25.

FIG. 26 shows an operation timing chart of FIG. 25. There will be described an operation in which in FIG. 25, the hierarchy A performs a read operation and the hierarchy B performs a verify read operation as the first step of a write operation.

The timing chart of FIG. 26 shows an example in which timing in which the read GBL drive signal GBLrDRVa is enabled in the hierarchy A and the sense amp SA (L) of the hierarchy outputs read data to the read main bit line GBLr is the same as timing (1-CYCLE ACCESS) of a clock signal (1-CYCLE) in which the verify GBL drive signal GBLrDRVb is enabled in the hierarchy B and the sense amp SA (L) of the hierarchy outputs read data to the verify main bit line GBLv for outputting data. In this case, the selector SEL connected to select signal ASL outputs a signal amplified by the main amp MAr of the hierarchy A connected to the read main bit line GBLr side to the data bus. After that, the selector SEL outputs a signal amplified by the main amp MAv on the hierarchy B side connected to the verify main bit line GBLv to the data bus. This allows the read operation to have priority over the verify operation, which may be reversed. When any one of the MAr and MAv performs a signal output operation, the other main amp may start an output operation after completion of the output.

Figure 27:
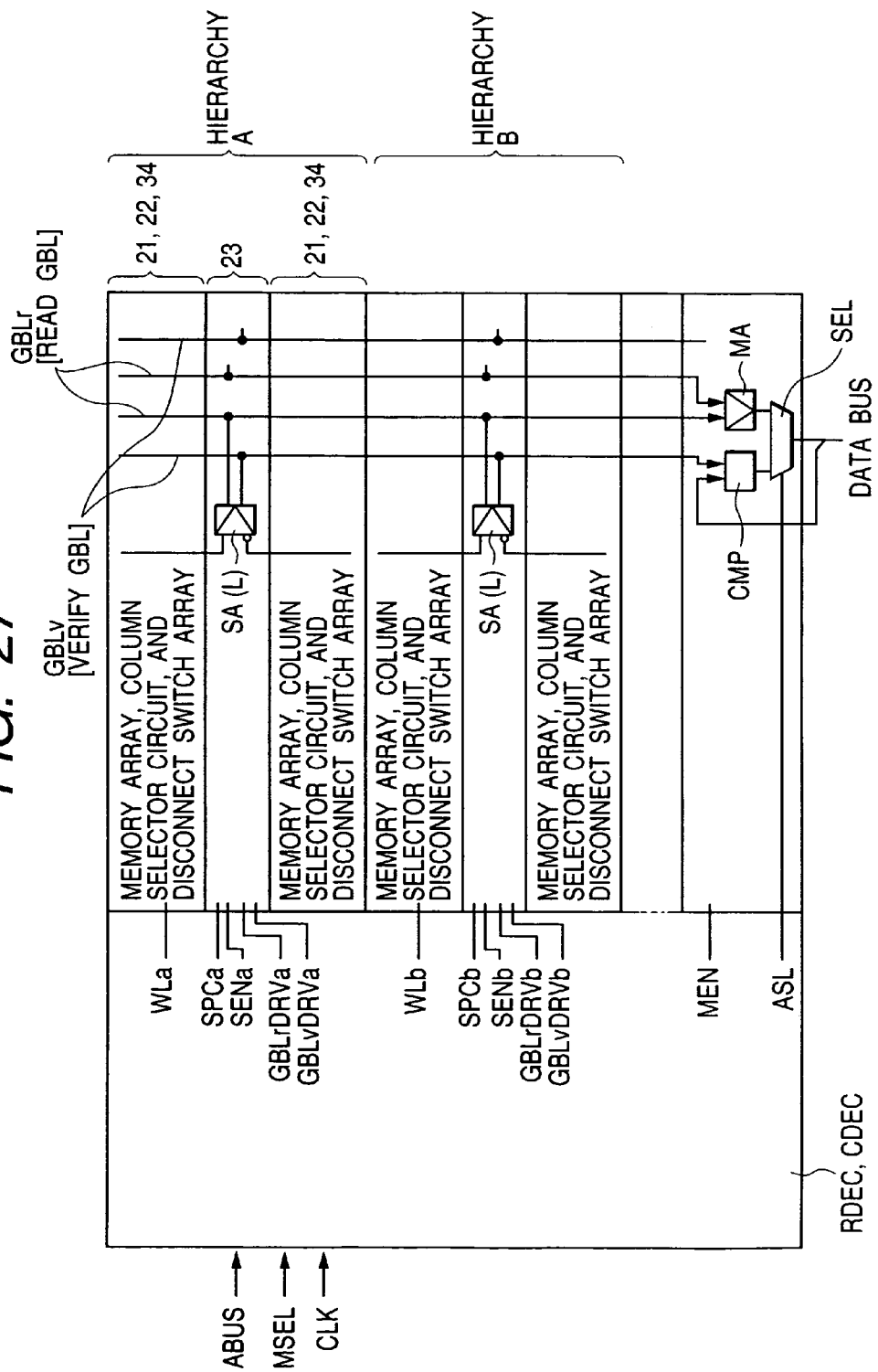
FIG. 27 is a block diagram schematically showing another flash memory when realizing read data conflict prevention.

FIG. 27 schematically shows another flash memory when realizing the read data conflict prevention. It is different from FIG. 25 in that the main amp MA is arranged for the read main bit line GBLr and verify comparator CMP is arranged for the verify main bit line GBLv. The verify comparator CMP compares the write data supplied from the data bus with the data read from the verify main bit line GBLv to decide whether the write operation is completed or not. In FIG. 27, SA(L) is a sense amp and GBLv [VERIFY GBL] and GBLr [READ GBL] are output signals of a sense amp.

Figure 28:
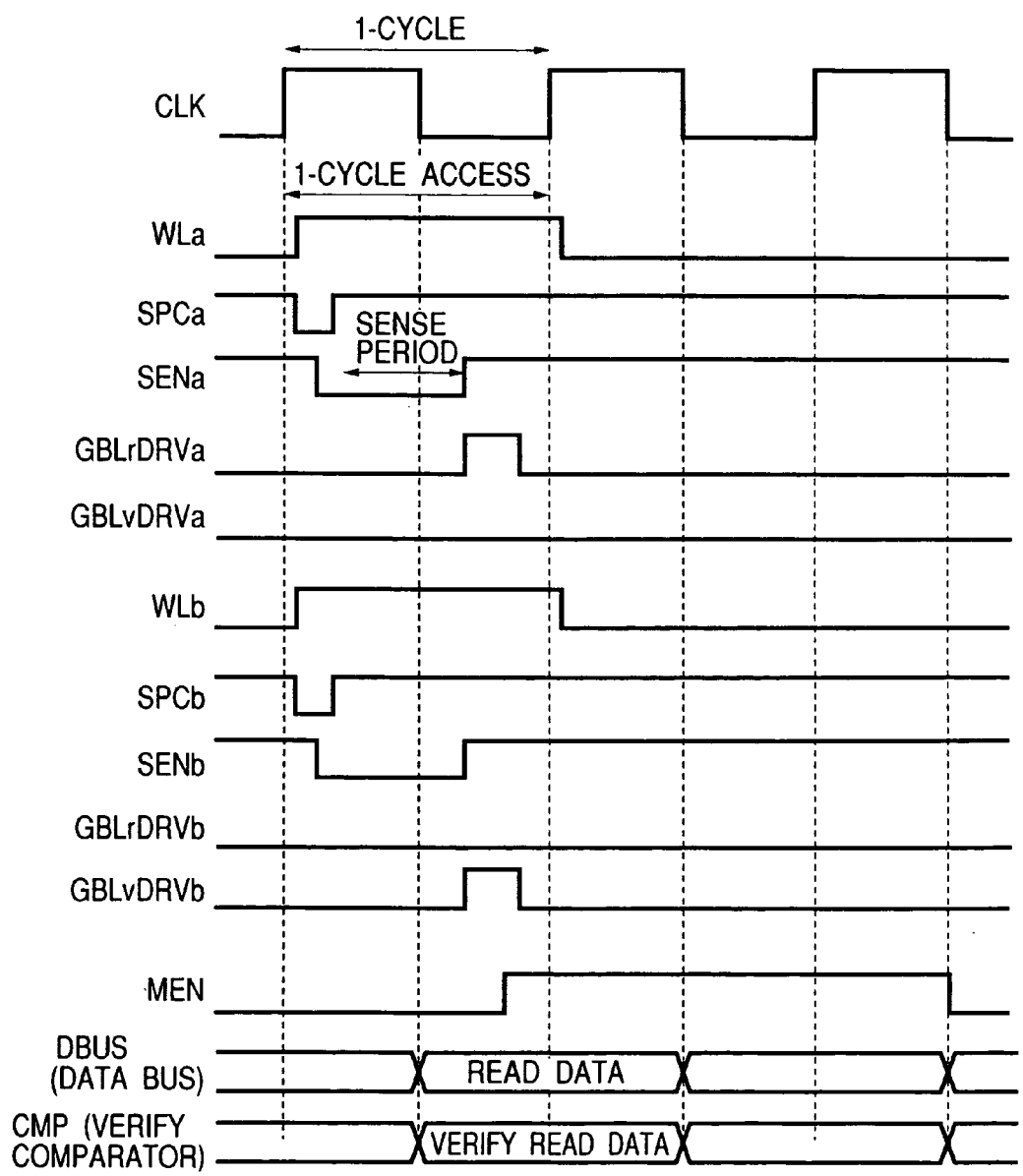
FIG. 28 is an operation timing chart of the flash memory shown in FIG. 27.

FIG. 28 shows an operation timing chart of FIG. 27. FIG. 28 shows an example in which in FIG. 27, the hierarchy A performs a read operation and the hierarchy B performs a verify read operation as the first step of a write operation. The timing chart of FIG. 28 shows an example in which timing in which the read GBL drive signal GBLrDRVa is enabled in the hierarchy A and the sense amp SA (L) of the hierarchy outputs read data to the read main bit line GBLr is the same as timing (1-CYCLE ACCES) of a clock signal (1-CYCLE) in which the verify GBL drive signal GBLvDRVb is enabled in the hierarchy B and the sense amp SA (L) of the hierarchy outputs read data to the verify main bit line GBLv. In this case, a signal amplified by the main amp MA connected to the read main bit line GBLr is outputted to the data bus. In parallel with this, the verify comparator CMP connected to the verify main bit line GBLv compares the write data with the data read from the verify main bit line GLBv. In the write data circuit, not shown, including the verify comparator CMP, the write operation is continued when the comparison result indicates that the write operation is not completed. The write is terminated to the memory cell to be written connected to the verify main bit line GBLv when the comparison result indicates that the write operation is completed. In FIG. 27, the write data is inputted directly from the data bus to the input of the verify comparator CMP which has an output signal CMP (VERIFY COMPARATOR). Actually, it should be understood that the write data is inputted via the write data latch and other write circuits, not shown.

The flash memory can perform the write and read operations in different hierarchies in parallel and can shorten turnaround time of the write and read operations in appearance.

Figure 29:
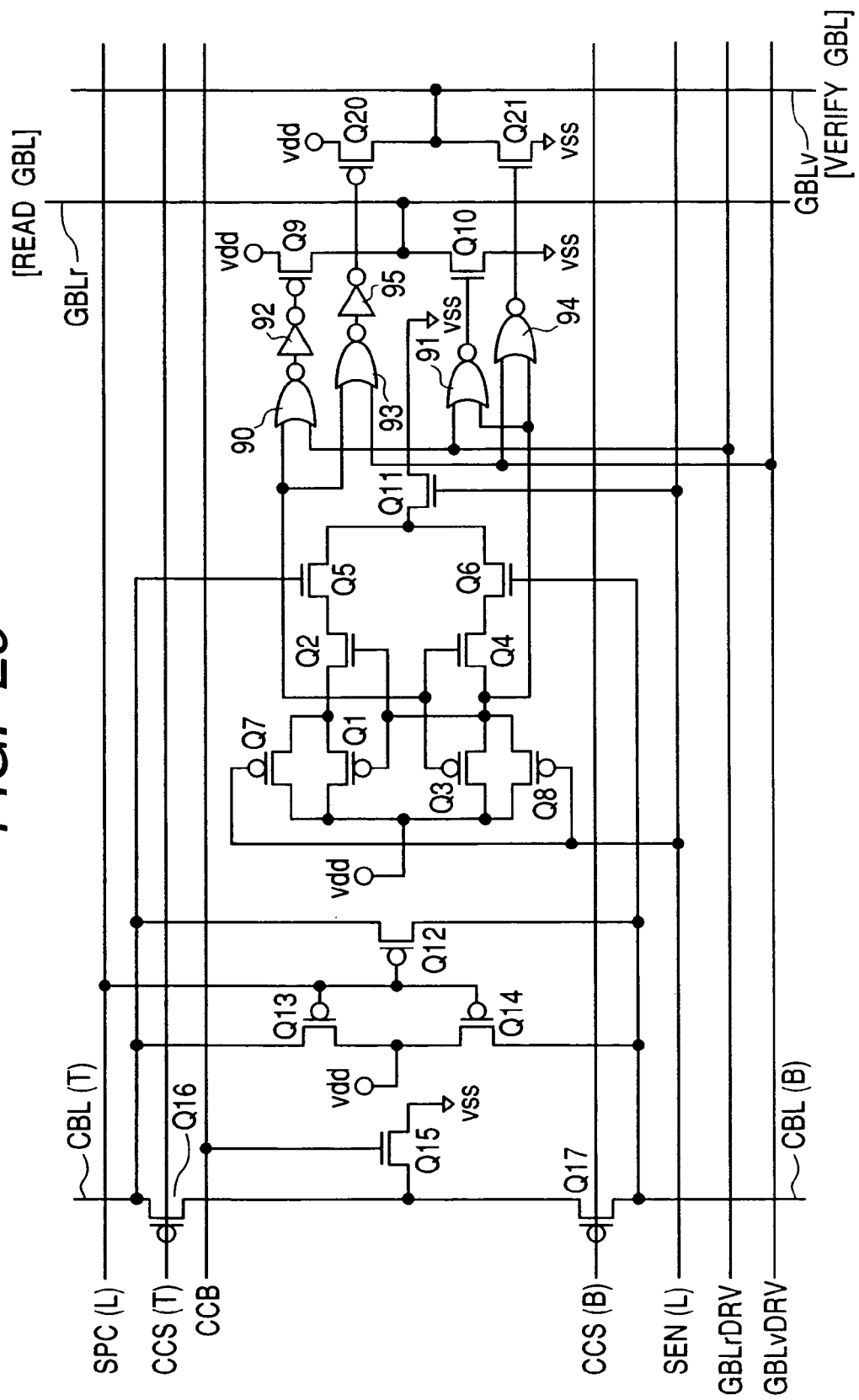
FIG. 29 is a circuit diagram illustrating a detail of the sense amp SA used in an embodiment shown in FIGS. 25 to 28.

FIG. 29 illustrates a detail of the sense amp SA used in the embodiment shown in FIGS. 25 to 28. The sense amp shown in the drawing has a selector circuit part deciding, by the read GBL drive signal GBLrDRV and the verify GBL drive signal GBLvDRV, to which of an output driver connected to the read main bit line GBLr and having the transistors Q9, Q10 and an output driver connected to the verify main bit line GBLv and having the transistors Q20, Q21 an output signal is supplied. The selector part has gate circuits 90 to 95. The structure of FIG. 29 is different from of that of FIG. 22 in that the output driver having the transistors Q20, Q21 and the selection logic having the gate circuits 90 to 95 are added. The sense amp SA is thus constructed to amplify and output a signal read from the memory cell to any one of the read main bit line GBLr and the verify main bit line GBLv in one amp circuit. In FIG. 29, signals CBL(T), CBL(B), CCB, CCS(B), CCS(T), and CCS(B) are input signals of a sense amp; signal SPC(L) is a control signal of a sense amp; and GBLr [READ GBL] and GBLv [VERIFY GBL] are output signals of a sense amp.

The above-described embodiments of the present invention can obtain the following operation effects.

(1) The bit line direction is divided into some parts. The column decoder and the read circuit such as the sense amp are arranged for the divided sub-bit lines. This can reduce the bit line load capacity.

(2) The column decoder and the sense amp are inserted between the upper and lower symmetrical sub-bit lines to operate the upper and lower column decoders in parallel. When reading the upper sub-bit line, the lower sub-bit line is a reference line. When reading the lower sub-bit line, the upper sub-bit line is a reference line. The potentials of the two sub-bit lines are compared by the differential sense amp. The differential sense of the bit line potentials contributes to a faster read operation.

(3) The output of each of the sense amp circuits can be drawn out to the memory array end via the read main bit line to be connected to the bus interface circuit.

(4) The structure connecting the read main bit line to the main amp is employed so that the read operation is much faster.

(5) Aside from the read main bit line, the write bit line is arranged to be connected to the divided sub-bit lines via the hierarchal switch (disconnect switch). This ensures parallel write of a set of write circuits.

(6) The verify read deciding completion of write/erase can be performed at a relatively low speed. The verify read uses the main bit line of the write. No circuits used for verify need be distributed.

(7) In the hierarchal sense method, a plurality of read circuits such as the sense amps are arranged in the memory mat. The sense amp is arranged to cross the bit line and the power source line also crosses the bit line. Since the plurality of sense amps operated cause current concentration, the power source width is large to suppress noise. The plurality of large power source widths increase the module area. When connecting the sub-bit line via the hierarchal switch to the write bit line, two bits or a plurality of sub-bit lines are connected to one write bit line. As a result, the metal pitch of the main bit lines is increased and the power source wire can be passed between the main bit lines. Operation power sources are supplied from the power source wire in parallel with the bit line to the read circuit such as the sense amp to prevent the module area from being increased. At the same time, increase in the metal layer can be suppressed. When a plurality of sense amps SA are operated in parallel, no current concentration occurs to suppress noise.

(8) The write main bit line different from the read main bit line is provided to perform read and write/erase in the same cycle to the memories in different sub-bit lines. The memories in the same sub-bit line must not be accessed in the same cycle to prevent read data and write data from being conflicted. To execute read and write/erase in the same cycle, two sets of the address latch circuit and the word line decoder circuit may be prepared for read and write/erase.

(9) The memory storing the rewrite sequence program of the flash memory and the memory rewritten by the user can be arranged in the same array. Both are divided using the read hierarchy sense and the write bit line structure. While reading and executing the rewrite sequence program, the memory of the user area can be rewritten. Unlike the prior art, the rewrite sequence program need not be transferred to the RAM and such flash memory can be mounted over the semiconductor integrated circuit not incorporating the RAM.

(10) The nonvolatile memory applying the present invention is used for the memory card to perform the read and write operations in parallel. Turnaround time seen from the user can be shortened.

(11) When performing the read operation and the verify read operation during the write operation in parallel in different hierarchies, the paths of the read data from both are individualized to solve the read data conflict from both. Turnaround time seen from the user can be shortened.

The present invention which has been made by the present inventors is specifically described above based on the embodiments. The present invention is not limited to them and various modifications can be made in the scope without departing from its purpose.

For example, the nonvolatile memory cell may perform information storage by the differences in the threshold voltage or perform information storage by the differences in the position of carrier injection of an electron. The information storage of one memory cell is not limited to one bit and may have a plurality of bits. The nonvolatile memory may have a plurality of memory mats to employ the hierarchal bit line structure of the memory arrays to each of them.

When applying the present invention to a semiconductor integrated circuit for data processing such as a microcomputer, the nonvolatile memory and the on-chip circuit module are not limited to the above examples and can be suitably modified. The present invention can be applied to a semiconductor integrated circuit having a single nonvolatile memory. The nonvolatile memory is not limited to the flash memory and may be a high-dielectric memory.

In the verify read explained with reference to FIG. 25 and later, instead of adding the verify main bit line, the write main bit line used for write can be used as a verify read main bit line.

The effects obtained by the representative inventions disclosed in the present invention will be briefly described as follows.

The load capacity connected to one sense amp can be reduced to significantly shorten read time. During read, write/erase can be performed to another memory.

The power source wire is passed between the bit lines. It is connected to a large number of sense amps. When the sense amps are operated in parallel, current concentration is difficult to occur. No wide power source wires need be distributed and arranged for each of the sense amp arrays, contributing to the smaller chip area.

The read main bit line is separated from the write main bit line to handle read data and write data in parallel. The data processing system using the semiconductor integrated circuit of the present invention can continue a service with data read without stopping the system during write/erase requiring relatively long time. When arranging the rewrite program in the same memory array, no exclusive memories storing the rewrite sequence are needed.

What is claimed is:

1. A semiconductor integrated circuit comprising a nonvolatile memory enabling electric erase and write over a semiconductor substrate,
   wherein said nonvolatile memory comprises a plurality of blocks each of which has a plurality of first bit lines, a plurality of second bit lines, a plurality of third bit lines and a plurality of first amplifiers,
   wherein each of said first bit lines is coupled with an input terminal of a corresponding one of said first amplifiers,
   wherein each of said second bit lines is coupled with an output terminal of a corresponding one of said first amplifiers, and
   wherein each of said third bit lines is selectively coupled with a corresponding one of said first bit lines and is used for transferring data to be written into a memory cell.

2. The semiconductor integrated circuit according to claim 1,
   wherein each of said first amplifiers is a differential amplifier having two input terminals and said output terminal, one input terminal is coupled to one of said first bit lines and the other input terminal is coupled to another of said first bit lines, and
   wherein each of said first amplifiers is capable of using a signal inputted in one of said two input terminals as a reference signal to sense data.

3. The semiconductor integrated circuit according to claim 1, further comprising a plurality of second amplifiers,
   wherein an input terminal of each of said second amplifiers is coupled to corresponding one of said second bit lines.

4. The semiconductor integrated circuit according to claim 3,
   wherein each of said second amplifiers is a differential amplifier having two input terminals and an output terminal, one input terminal is coupled to one of said second bit lines and the other input terminal is coupled to another of said second bit lines, and
   wherein each of said second amplifiers is capable of using a signal inputted in one of said two input terminals as a reference signal to sense data.

5. The semiconductor integrated circuit according to claim 2, further comprising a first switch circuit,
   wherein said first switch circuit is arranged between said first bit lines and said first amplifiers for selecting one of said first bit lines to be coupled with said one input terminal of said first amplifier.

6. The semiconductor integrated circuit according to claim 5, further comprising a second switch circuit,
   wherein said second switch circuit is arranged between said first bit lines and said third bit lines for coupling said corresponding one of said first bit lines with one of said third bit lines.

7. The semiconductor integrated circuit according to claim 6, further comprising a plurality of third amplifiers each of which is coupled with a corresponding one of said third bit lines and is capable of sensing verify read data from a coupled third bit line.

8. The semiconductor integrated circuit according to claim 1,
   wherein first power source wires are provided in parallel for every first amplifier, second power source wires wider than the first power source wires are provided in positions spaced from the first power source wires, and the first power source wires are coupled to the second power source wires by third power source wires laid in the first bit line direction.

9. The semiconductor integrated circuit according to claim 8, further comprising:
   a plurality of third bit lines for write shared between said plurality of blocks in such a manner that one of the plurality of third bit lines is provided for every two first bit lines; and
   said second switch circuit being capable of selectively coupling one third bit line to any one of the corresponding two first bit lines in each of said blocks.

10. The semiconductor integrated circuit according to claim 9,
    wherein said third power source wires are arranged between every two adjacent first bit lines.

11. The semiconductor integrated circuit according to claim 6, further comprising:
    a first address decoder being used in a read operation for selecting one of a plurality of word lines, ones of said first bit lines, said second switch circuit and ones of said first amplifiers; and
    a second address decoder being used in a write operation for selecting one of said word lines and said second switch circuit.

12. The semiconductor integrated circuit according to claim 11,
    wherein each of said first address decoder and said second address decoder includes address code logic performing address mapping so that said blocks, each of which couples to one of said first amplifiers via said first bit lines therein, are arranged with non-consecutive addresses.

13. The semiconductor integrated circuit according to claim 12,
    wherein in a read operation, the first address decoder holds an address decode signal and a select signal of the first bit line for each of said blocks corresponding to a change of an address signal during a number of cycles necessary for the read operation, and responds to the change of the address signal to operate said first amplifiers with delay.

14. The semiconductor integrated circuit according to claim 12,
    wherein in a read operation, the first address decoder selects, in parallel, word lines and first bit lines according to an address and a next address, each of which is specified by address signals, drive controls the driving of the second bit line of respective first amplifiers corresponding to said specified address and continuously drive controls corresponding to said next address.

15. The semiconductor integrated circuit according to claim 12, further comprising a central processing unit capable of accessing said nonvolatile memory on said semiconductor substrate.

16. The semiconductor integrated circuit according to claim 15,
    wherein one or more of said plurality of blocks are used as a data area, a remaining number of said plurality of blocks are used as a management area, and said management area includes a storage area of a rewrite sequence control program for rewriting the data area,
    wherein said central processing unit reads and executes the rewrite sequence control program from said storage area and enables rewrite control of the data area.

17. A semiconductor integrated circuit comprising: a nonvolatile memory enabling electric erase and write; and a central processing unit capable of accessing said nonvolatile memory on a semiconductor substrate, wherein said nonvolatile memory comprises a hierarchal bit line structure including first bit lines specific to each of a plurality of memory arrays, a plurality of second bit lines shared between the first bit lines of the plurality of memory arrays, and a plurality of sense amps arranged between said first bit lines and second bit lines, and a number of said second bit lines is smaller than a parallel write bit number to the memory array.

18. The semiconductor integrated circuit according to claim 17, further comprising a third bit line for write shared between said plurality of memory arrays.

19. The semiconductor integrated circuit according to claim 18, further comprising a disconnect circuit capable of connecting and disconnecting a corresponding first bit line for each of the memory arrays to/from the third bit line, wherein the disconnect circuit effects said disconnecting in a read operation.

20. A semiconductor integrated circuit comprising a nonvolatile memory enabling electric erase and write on a semiconductor substrate, wherein said nonvolatile memory comprises a hierarchal bit line structure including first bit lines specific to each of a plurality of memory arrays, a second bit line shared between the first bit lines, and a sense amp selectively amplifying data read from each said first bit line to output the amplified data to the second bit line.

* * * * *